(12) United States Patent
Hayashi et al.

(10) Patent No.: US 7,671,383 B2
(45) Date of Patent: Mar. 2, 2010

(54) SEMICONDUCTOR DEVICE AND METHOD OF PRODUCING THE SAME

(75) Inventors: Tetsuya Hayashi, Yokosuka (JP); Masakatsu Hoshi, Yokohama (JP); Yoshio Shimoida, Yokosuka (JP); Hideaki Tanaka, Yokohama (JP); Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 226 days.

(21) Appl. No.: 11/714,214

(22) Filed: Mar. 6, 2007

(65) Prior Publication Data

US 2007/0210330 A1     Sep. 13, 2007

(30) Foreign Application Priority Data

Mar. 10, 2006   (JP) .............................. 2006-066492

(51) Int. Cl.
*H01L 29/732* (2006.01)

(52) U.S. Cl. ..................... 257/192; 438/285; 438/590; 257/E33.016; 257/E33.034; 257/E29.097; 257/E29.14; 257/E21.047; 257/E21.086; 257/E21.093; 257/E21.103; 257/E21.116; 257/E21.403; 257/E21.407

(58) Field of Classification Search .................. 257/20, 257/77, 183, 192, E29.013, E29.081, E29.104, 257/E29.262, E21.047, E21.086, E21.093, 257/E21.103, E21.116, E21.403, E21.407, 257/E21.448, E33.016, E33.034, E29.097, 257/E29.14; 438/285, 590

See application file for complete search history.

(56) References Cited

U.S. PATENT DOCUMENTS 6,465,842 B2 * 10/2002 Nishinohara ................. 257/330
2005/0199873 A1 * 9/2005 Tanaka et al. ................. 257/20

FOREIGN PATENT DOCUMENTS

JP            2003-318398 A        11/2003

* cited by examiner

*Primary Examiner*—A. Sefer
*Assistant Examiner*—Farid Khan
(74) *Attorney, Agent, or Firm*—Foley & Lardner LLP

(57) ABSTRACT

A semiconductor device, includes: a first conductivity type semiconductor base having a main face; a hetero semiconductor region contacting the main face of the semiconductor base and forming a hetero junction in combination with the semiconductor base, the semiconductor base and the hetero semiconductor region in combination defining a junction end part; a gate insulating film defining a junction face in contact with the semiconductor base and having a thickness; and a gate electrode disposed adjacent to the junction end part via the gate insulating film and defining a shortest point in a position away from the junction end part by a shortest interval, a line extending from the shortest point to a contact point vertically relative to the junction face, forming such a distance between the contact point and the junction end part as to be smaller than the thickness of the gate insulating film contacting the semiconductor base.

14 Claims, 18 Drawing Sheets

SEMICONDUCTOR DEVICE AND METHOD OF PRODUCING THE SAME

BACKGROUND OF THE INVENTION

1. Field of the Invention

The present invention relates to a semiconductor device of a field effect transistor having a hetero junction and to a method of producing the semiconductor device.

2. Description of the Related Art

Japanese Patent Application Laid-Open No. JP2003-318398 (=JP2003318398) discloses a conventional semiconductor device. According to the above conventional technology, a semiconductor base has a first main face where an $N^-$ type silicon carbide epitaxial region 20 is formed on an $N^+$ type silicon carbide substrate 10. An $N^-$ type polycrystalline silicon region 60 contacts the first main face, allowing the epitaxial region 20 and the $N^-$ type polycrystalline silicon region 60 in combination to form a hetero junction. Moreover, adjacent to a junction face between the epitaxial region 20 and the $N^-$ type polycrystalline silicon region 60, a gate electrode 40 is formed via a gate insulating film 30.

The $N^-$ type polycrystalline silicon region 60 is connected to a source electrode 80, while the $N^+$ type silicon carbide substrate 10 has a backface formed with a drain electrode 90.

SUMMARY OF THE INVENTION

It is an object of the present invention to provide a hetero junction-included semiconductor device featuring a decreased on resistance. It is another object of the present invention to provide a method of producing the above semiconductor device.

According to a first aspect of the present invention, there is provided a semiconductor device, comprising: 1) a first conductivity type semiconductor base having a main face; 2) a hetero semiconductor region configured to contact the main face of the semiconductor base and to form a hetero junction in combination with the semiconductor base, the semiconductor base and the hetero semiconductor region in combination defining a junction end part; 3) a gate insulating film configured to define a junction face in contact with the semiconductor base and to have a thickness; and 4) a gate electrode disposed adjacent to the junction end part via the gate insulating film and configured to define a shortest point in a position away from the junction end part by a shortest interval, a line extending from the shortest point to a contact point substantially vertically relative to the junction face, forming such a distance between the contact point and the junction end part as to be smaller than the thickness of the gate insulating film contacting the semiconductor base.

According to a second aspect of the present invention, there is provided a method of producing a semiconductor device, comprising: 1) a first operation for forming a hetero semiconductor region on a first conductivity type semiconductor base, forming a hetero junction therebetween; 2) a second operation for forming on the hetero semiconductor region a mask material for selectively removing the hetero semiconductor region; 3) a third operation for selectively removing the hetero semiconductor region with the mask material as a mask; 4) a fourth operation for forming a gate insulating film on the semiconductor base and on the hetero semiconductor region, such that the gate insulating film is configured to define a junction face in contact with the semiconductor base; 5) a fifth operation for forming a gate electrode adjacent to a junction end part via the gate insulating film, the junction end part being defined between the semiconductor base and the hetero semiconductor region, wherein the third operation includes forming such a distance between a contact point and the junction end part as to be smaller than a thickness of the gate insulating film contacting the semiconductor base, wherein-above the gate electrode is configured to define a shortest point in a position away from the junction end part by a shortest interval and a line extends from the shortest point to the contact point substantially vertically relative to the junction face.

The other object(s) and feature(s) of the present invention will become understood from the following description with reference to the accompanying drawings.

DESCRIPTION OF THE PREFERRED EMBODIMENTS

In the following, various preferred embodiments of the present invention will be described in detail with reference to the accompanying drawings.

For ease of understanding, the following description will contain various directional terms, such as left, right, upper, lower, forward, rearward and the like. However, such terms are to be understood with respect to only a drawing or drawings on which the corresponding part of element is illustrated.

Hereinafter, the superscript "+" and the superscript "−" on "N" or "P" each denoting conductivity (negative or positive) of the semiconductor denote, respectively, high density and low density.

First Embodiment

[Structure]

Figure 1:
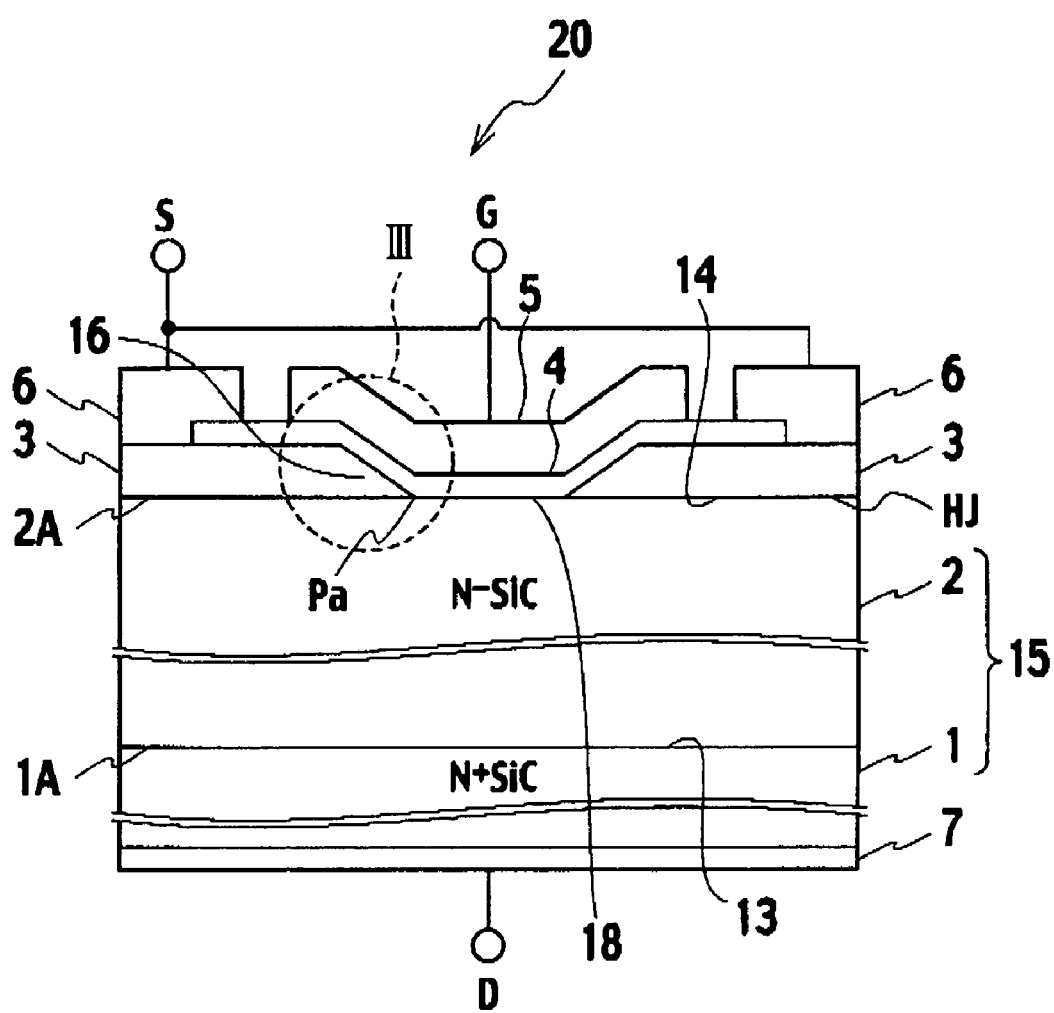
FIG. 1 is a cross sectional view showing a structure of a semiconductor device, according to a first embodiment of the present invention.

FIG. 1 is a cross sectional view showing a structure of a semiconductor device 20, according to the first embodiment of the present invention. In FIG. 1, two unit cells of a field effect transistor serving as the semiconductor device 20 according to the first embodiment oppose each other. Hereinafter, a substrate is made of silicon carbide, according to each of the first to third embodiments of the present invention.

In FIG. 1, an $N^+$ type substrate region 1 (with polytype of silicon carbide, for example, 4H type) in combination with an $N^-$ type drain region 2 formed thereon forms a semiconductor base 15. There is formed a hetero semiconductor region 3 which is made of, for example, N type polycrystalline silicon.

The hetero semiconductor region 3 contacts a main face 2A of the drain region 2 in such a configuration as to oppose a junction face 13 between the $N^+$ type substrate region 1 and the drain region 2. That is, a junction face 14 between the drain region 2 (made of silicon carbide) and the hetero semiconductor region 3 (polycrystalline silicon) having materials different in band gap form a hetero junction HJ. The hetero junction HJ has an interface including an energy barrier.

In such a configuration as to contact the junction face 14 between the hetero semiconductor region 3 and the drain region 2, there is formed a gate insulating film 4 which is made of, for example, silicon oxide film. Moreover, there is formed a gate electrode 5 on the gate insulating film 4. There is formed a source electrode 6 in such a configuration as to oppose the junction face 14 between the hetero semiconductor region 3 and the drain region 2. A drain electrode 7 connects to the substrate region 1.

Moreover, according to the first embodiment, as shown in FIG. 1, the hetero semiconductor region 3, the drain region 2 and the gate insulating film 4 in combination contact at a contact point (hereinafter referred to as "triple point Pa"). A junction end part 16 (3-region intersection) disposed between the drain region 2 and the hetero semiconductor region 3 and including the triple point Pa forms an acute angle.

Then, referring to stepwise cross sectional views in FIG. 2A to FIG. 2D, an example of a method of producing the semiconductor device 20 in FIG. 1 is to be set forth.

First, on the $N^+$ type substrate region 1, the $N^-$ type drain region 2 is epitaxially grown, to thereby form the N type silicon carbide semiconductor base 15. On the N type silicon carbide semiconductor base 15 a polycrystalline silicon layer is stacked, for example, through a method such as an LP-CVD (Low Pressure Chemical Vapor Deposition). Then, for example, an ion implantation method is used for introducing impurities such as phosphor and arsenic, to thereby form the N type hetero semiconductor region 3.

In this case, the polycrystalline silicon layer may be formed in the following operations: depositing polycrystalline silicon through an electron beam evaporating method, a spattering method and the like, followed by a laser anneal and the like for recrystallization. Otherwise, the N type hetero semiconductor region 3 may be made of single crystalline silicon which is hetero-epitaxially grown through, for example, a molecular beam epitaxy and the like. Moreover, for doping the impurity, a solid phase diffusion or a gas phase diffusion may be used.

Figure 2A:
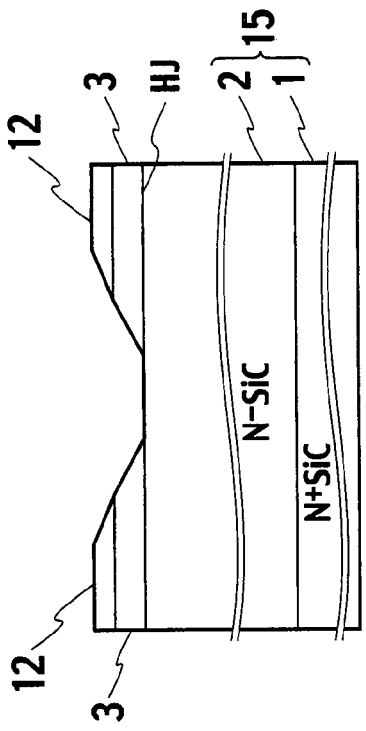
FIG. 2A to FIG. 2D are stepwise cross sectional views showing a method of producing the semiconductor device, according to the first embodiment of the present invention.

Then, a certain mask material 12 is formed on the hetero semiconductor region 3 through, for example, a photo lithography and the like. In this case, varying the configuration of the end part of the mask material 12 by varying type or thickness of the photoresist for the mask material 12 or by controlling lithography conditions can control a first angle θsi (to be set forth afterward referring to FIG. 3) of the junction end part 16. Therefore, as shown in FIG. 2A, aggressively forming in advance the end part of the mask material 12 into an acute angle can make the first angle θsi more acute. Moreover, the mask material 12 may be made of other materials such as $SiO_2$ film, SiN film and the like (see FIG. 2A).

Then, with the mask material 12 used as a mask, the hetero semiconductor region 3 is selectively removed through, for example, a reactive ion etching (dry etching). In this case, the mask material 12 also is etched at a certain selection ratio in combination with the hetero semiconductor region 3, a thin end part of the mask material 12 is etched in such a configuration that the end part per se gradually moves back, thus gradually expanding an open part of the hetero semiconductor region 3 layer. With the above operations, at the end of the etching, the end part 16 of the hetero semiconductor region 3 is caused to have an inclination corresponding to the above moving back of the mask material 12, thus controlling the first angle θsi.

Figure 2B:
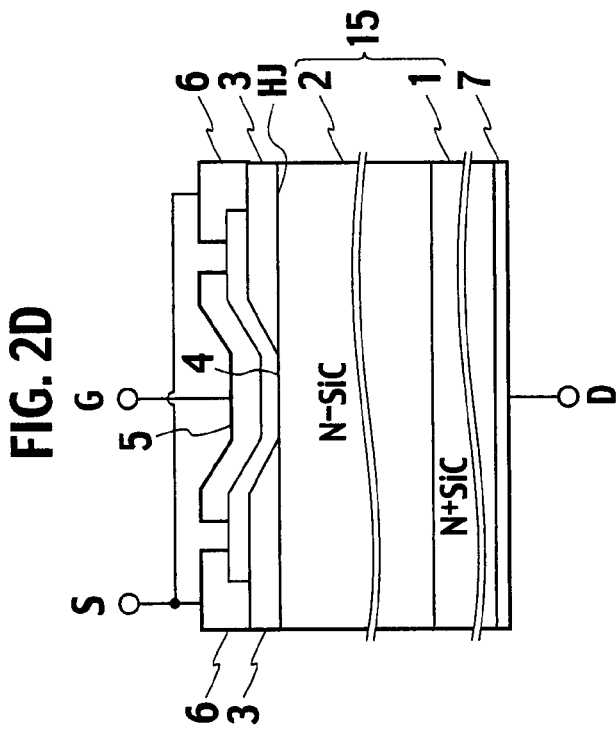

Herein, other examples of the etching method include i) a wet etching method, and ii) an oxidation and oxide film removal etching method. In combination with the above processes, the end part 16 of the hetero semiconductor region 3 can be controllably formed into any configurations (FIG. 2B).

Then, after removing the mask material 12, for example, an etching damage caused by dry etching may be removed through, for example, i) sacrificial oxidation by dry $O_2$ oxidation at 900° C. and ii) sacrificial oxide film removal by wet etching using a mix solution of ammonium fluoride and hydrofluoric acid. The above dry $O_2$ oxidation is raised as an example for forming the sacrificial oxide film, but not particularly limited thereto. Any other methods capable of removing the etching damage of the drain region 2 are allowed. Herein, the etching damage removing operation by the above sacrificial oxidation and the like may be implemented without removing the mask material 12 when the mask material is special.

Then, along a surface layer part of each of the hetero semiconductor region 3 and the drain region 2, the gate insulating film 4 is formed. The gate insulating film 4 may be formed through a thermal oxidation, or may be an oxide film formed through a CVD (Chemical Vapor Deposition) method. Moreover, the gate insulating film 4 may be formed by forming an oxide film, followed by an annealing at a certain temperature and in a certain atmosphere.

Then, a polycrystalline silicon layer serving as the gate electrode 5 is deposited on the gate insulating film 4 through, for example, the LP-CVD method. Then, for example, the ion implantation method is used for introducing impurities such as phosphor and arsenic into the polycrystalline silicon layer, to thereby form the N type gate electrode 5 layer. Herein, the impurity introduction may be implemented by the solid phase diffusion or the gas phase diffusion.

Figure 2C:
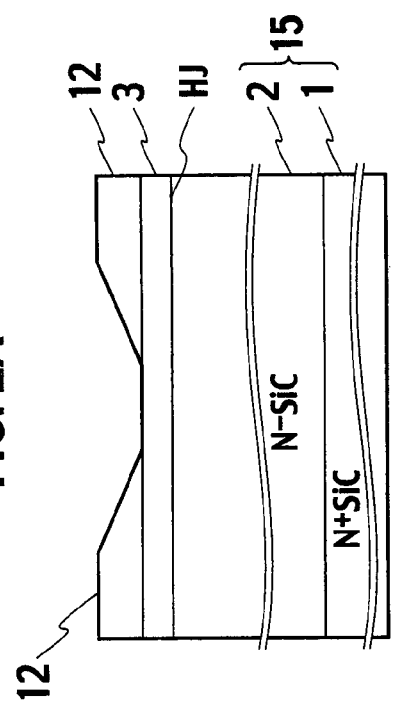

Then, a certain mask material is formed on the gate electrode 5 layer through, for example, the photo lithography, then, the gate electrode 5 layer is selectively etched through, for example, the reactive ion etching (dry etching) and then patterned, to thereby form the gate electrode 5. In this case, the mask material may be made of other materials such as $SiO_2$ film, SiN film and the like (FIG. 2C).

Figure 2D:
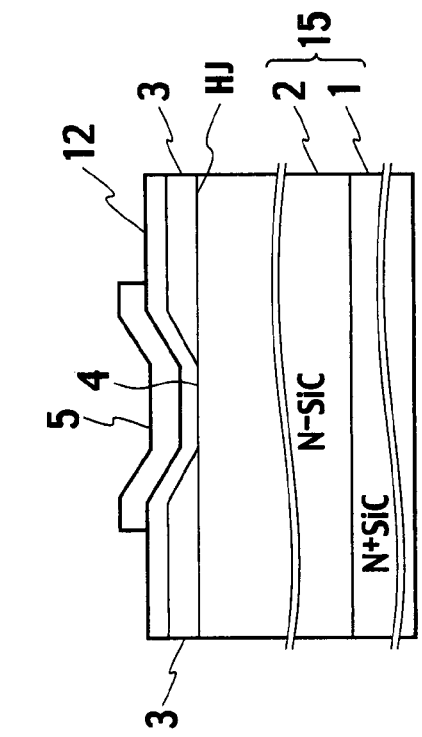

Finally, after removing the above mask material, an interlayer film and the like is formed when necessary, to thereby form on the substrate region 1 (a backface side of the semiconductor base 15) the drain electrode 7 which is made of, for example, titanium (Ti), nickel (Ni) and the like. Moreover, on a surface side the substrate region 1, a certain contact hole is formed in such a configuration as to contact the hetero semiconductor region 3, followed by forming the source electrode 6 made of, for example, titanium (Ti), aluminum (Al) and the like, to thereby complete the semiconductor device 20 in FIG. 1 according to the first embodiment (FIG. 2D).

As set forth above, the semiconductor device 20 according to the first embodiment can be realized easily according to a conventional production technology.

[Operation]

Then, an operation of the semiconductor device 20 in FIG. 1 is set forth, according to the first embodiment.

According to the first embodiment, for operating the semiconductor device 20, for example, the source electrode 6 is grounded and a positive potential is applied to the drain electrode 7. First, setting the gate electrode 5, for example, to a grounding potential or a negative potential keeps a cutoff state. This is because an interface of the hetero junction HJ between the hetero semiconductor region 3 and the drain region 2 is formed with the energy barrier to a conduction electron.

Then, applying the positive potential to the gate electrode 5 for converting the cutoff state to a conduction state forms an electron accumulative layer on the surface layer part of each of the hetero semiconductor region 3 and the drain region 2, where the surface layer part is within the reach of the gate field via the gate insulating film 4. With this, at the surface layer part of each of the hetero semiconductor region 3 and the drain region 2, there is formed a potential where a free electron is allowed to exist to such an extent as to be adjacent to the triple point Pa, the energy barrier extending to the drain region 2 side becomes precipitous, thereby thinning the energy barrier, resulting in flowing of electron current.

In this case, according to the first embodiment, applying the gate voltage and the drain voltage equivalent to those according to the conventional technology can flow a current with a resistance lower than that according to the conventional technology. The reasons therefor are to be set forth hereinafter.

Figure 3:
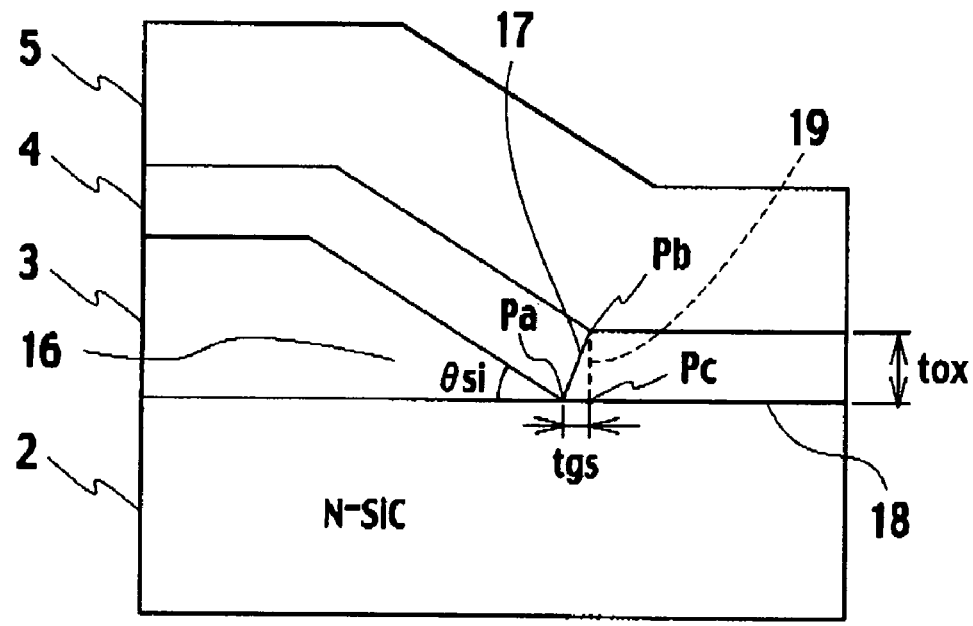
FIG. 3 shows an enlarged view of a part III in FIG. 1.

FIG. 3 shows an enlarged view of a part III encircled by a broken line in FIG. 1. In FIG. 3, the first angle θsi of the hetero semiconductor region 3's end part 16 contacting the triple point Pa is varied from the conventional 90° to acute angles, for example, 60°, 45° and 30°, thereafter implementing numeric calculation of changes of conductivity of the transistor. In the above numeric calculation, the following model parameters are used:

i) drain region 2:
N type 4H—SiC with impurity concentration of $10^{16}$ cm$^{-3}$, ii) hetero semiconductor region 3:
N type single crystalline Si with impurity concentration of $10^{20}$ cm$^{-3}$, and iii) gate insulating film 4:
$SiO_2$.

Figure 4:
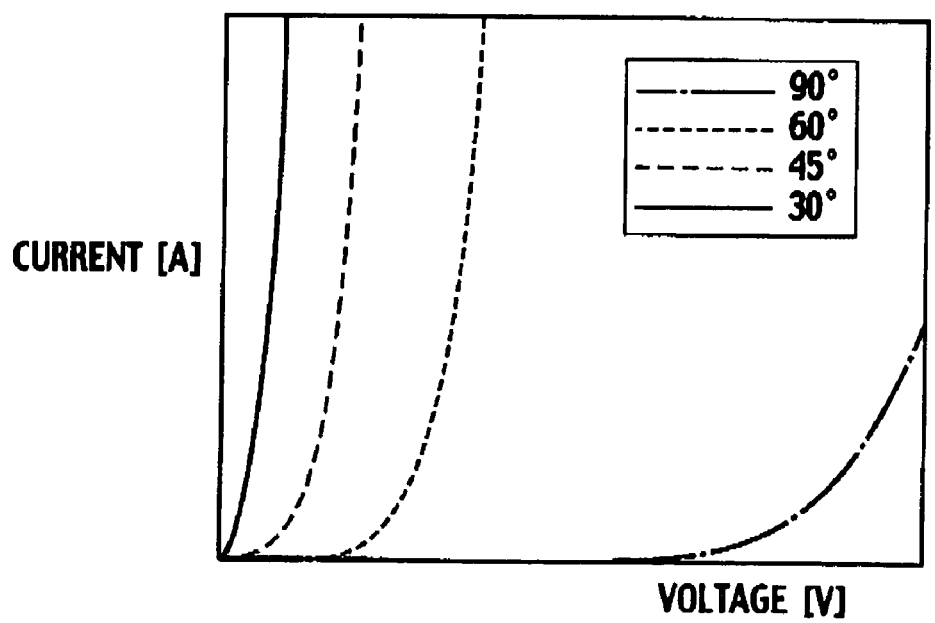
FIG. 4 shows current I-voltage V characteristic of the semiconductor device, according to the first embodiment.

Then, a source potential is applied to a certain part of the hetero semiconductor region 3, a drain potential is applied to a certain part of the drain region 2, and a gate potential is applied to a certain part of the gate insulating film 4. With the source potential grounded and the gate potential set to a certain potential, FIG. 4 shows the drain current relative to drain voltage, denoting current I-voltage V. As shown in FIG. 4, the more acute (smaller) the first angle θsi is, the lower the rising drain voltage is in the I-V characteristic, showing a lower on resistance.

The more acute first angle θsi shows lower on resistance due to two structural reasons, which has been found out through a further analysis by the numeric calculation.

The first reason is to be set forth. Making the first angle θsi of the end part 16 of the hetero semiconductor region 3 more acute applies higher gate field to the triple point Pa. As set forth above, according to the first embodiment, the gate field forms the accumulative layer on the surface layer part of the drain region 2 to such an extent that the accumulative layer reaches adjacent to the triple point Pa, thinning the energy barrier extending to the drain region 2 side, thus flowing the electron current. With this, preferably, the high gate field is applied especially to the triple point Pa along the drain region 2's surface layer part contacting the gate insulating film 4.

In FIG. 3, a distance tgs is defined between i) the triple point Pa and ii) a contact point Pc, where the contact point Pc is an end point of a vertical line 19 from a shortest point Pb (by a shortest interval 17 from the triple point Pa) of the gate electrode 5 to the drain region 2's contact face contacting the gate insulating film 4. The drain region 2's surface layer part within a range of the distance tgs from the triple point Pa is larger than a thickness tox of the gate insulating film 4, where the thickness tox is defined as a distance from the gate electrode 5 to the drain region 2. With this, on the drain region 2's surface layer part within the range of the distance tgs from the triple point Pa, the gate field becomes gradually smaller toward the triple point Pa than on the drain region 2's certain part forming a shortest interval (from the gate electrode 5) equivalent to the thickness tox. In sum, the smaller the distance tgs, the higher the gate field is applied to the drain region 2's surface layer part adjacent to the triple point Pa, thus decreasing the on resistance.

That is, contrary to the conventional technology having the first angle θsi of 90° causing the above distance tgs substantially equivalent to the distance tox, the acute first angle θsi according to the first embodiment of the present invention can make the distance tgs smaller than the thickness tox (for example, with the first angle θsi of 30°, the distance tgs being about half the thickness tox), thereby bringing about the on resistance lower than that according to the conventional technology, as shown in FIG. 4.

Then, the second reason is to be set forth. Making the first angle θsi of the end part 16 of the hetero semiconductor region 3 more acute can apply higher drain field to the triple point Pa. The drain field applied to the triple point Pa works to make the potential barrier more precipitous, which barrier caused between the hetero semiconductor region 3 and the drain region 2. With this, the thus applied higher drain field can bring about further lower on resistance.

According to the first embodiment, the end part 16 of the hetero semiconductor region 3 having the acute angle can bring about higher drain field in the triple point Pa than the conventional technology, bringing about the I-V characteristic having a lower on resistance.

As set forth above, according to the first embodiment, making the distance tgs smaller than the thickness tox of the gate insulating film 4 and making the first angle θsi acute can apply to the triple point Pa the gate field and drain field which are higher than those according to the conventional technology, thereby further decreasing the on resistance than the conventional technology.

Then, according to the first embodiment, making again the gate electrode 5 into the grounding potential for moving from the conduction state to the cutoff state will release the conduction electron's accumulative state formed in the interface of the hetero junction HJ between the hetero semiconductor region 3 and the drain region 2, thus stopping tunneling in the energy barrier. Then, the conduction electron flow from the hetero semiconductor region 3 to the drain region 2 stops. Then, the conduction electron in the drain region 2 flows to the substrate region 1 and is depleted, thereby expanding a depletion layer on the drain region 2 side from the hetero junction HJ, bringing about the cutoff state.

Moreover, like the conventional technology, a reverse conduction (reflux) can be realized according to the first embodiment by, for example, grounding the source electrode 6 and applying the negative potential to the drain electrode 7. For example, applying a certain positive potential to the drain electrode 7 with the source electrode 6 and gate electrode 5 grounded deletes the energy barrier to the conduction electron, thereby flowing the conduction electron from the drain region 2 side to the hetero semiconductor region 3 side, bringing about the reverse conduction state. In this case, the conduction electron alone without injecting a positive hole can bring about the conduction, thus making a loss smaller which loss may be caused by a reverse recovery current from the reverse conduction state to the cutoff state. Otherwise, without being grounded, the gate electrode 5 can be used as control electrode.

Modified Structures:

As set forth above, according to the first embodiment, the end part 16's structure of the hetero semiconductor region 3 is shown in FIG. 3, for setting forth the specific effect. According to the first embodiment, however, the following first to fifth modified structures shown respectively in FIG. 5 to FIG. 9 can also bring about similar effects.

Figure 5:
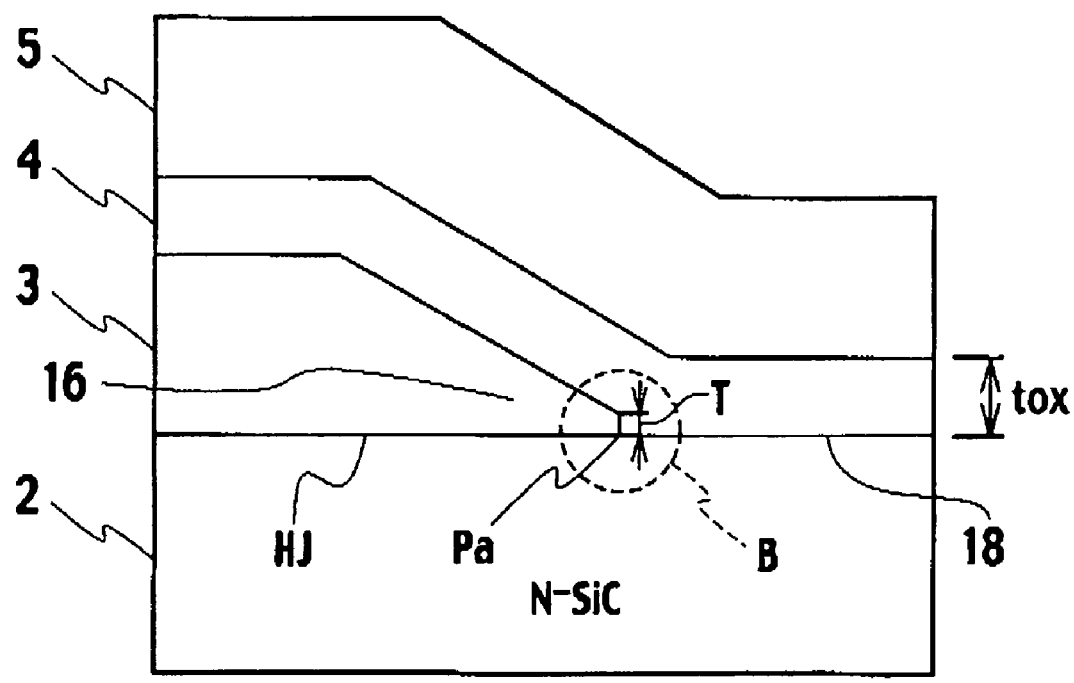
FIG. 5 shows a first modified structure of the semiconductor device, according to the first embodiment of the present invention.

FIG. 5 shows the first modified structure where a part B encircled by a broken line has the triple point Pa having a thick part. For realizing the acute angle through a general semiconductor process, practically, the junction end part 16 is formed thicker than that shown in FIG. 3. A thickness T of the junction end part 16 smaller than the thickness tox of the gate insulating film 4, however, can bring about substantially the same effect as that in FIG. 3.

Figure 6:
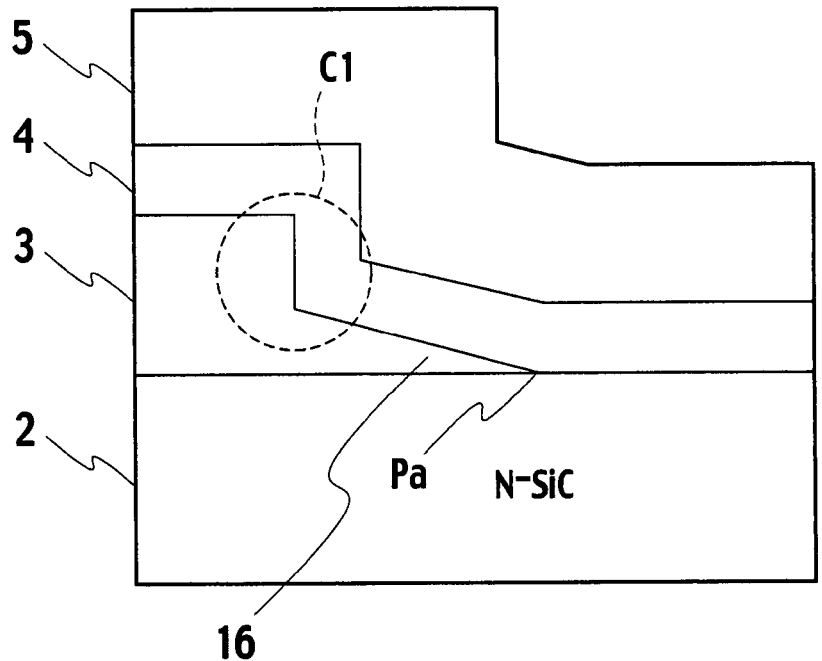
FIG. 6 shows a second modified structure of the semiconductor device, according to the first embodiment of the present invention.
Figure 7:
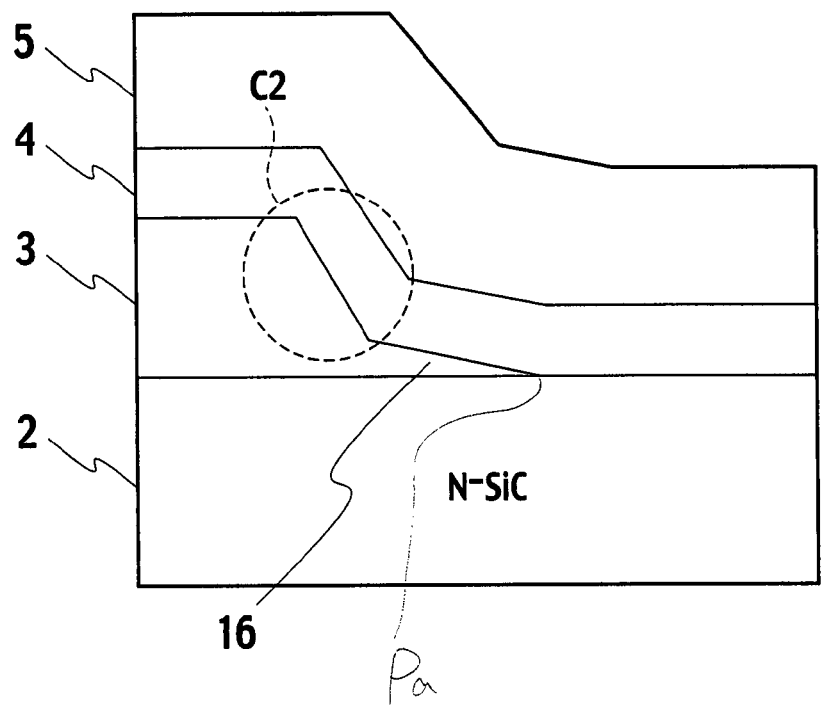
FIG. 7 shows a third modified structure of the semiconductor device, according to the first embodiment of the present invention.

FIG. 6 and FIG. 7 respectively show the second and third modified structures where a part C1 (FIG. 6) and a part C2 (FIG. 7) encircled by respective broken lines each have a certain step in a position spaced apart by a certain distance from the triple point Pa of the hetero semiconductor region 3.

Under the present invention, the configuration adjacent to the triple point Pa is such that at least the distance tgs is smaller than the thickness tox of the gate insulating film 4, bringing about at least the above effect. Therefore, any other structures at least meeting the above configuration are allowed on the hetero semiconductor region 3 side spaced apart from the triple point Pa. That is, a right angle step in FIG. 6 and an obtuse angle step in FIG. 7, and an acute angle step (not shown) are allowed.

With the above configurations, the triple point Pa serving as a drive point of the transistor can obtain the drive force with the acute angle, and the resistance of the hetero semiconductor region 3 per se from the triple point Pa to the source electrode 6 can be made low due to a certain thickness secured in a wide range.

Herein, for example, the reactive ion etching (dry etching) is used for forming the configuration to a certain thickness, then, the remnant is subjected to a treatment such as i) the wet etching method and ii) the oxidation and oxide film removal etching method, thus easily realizing the above configuration.

Figure 8:
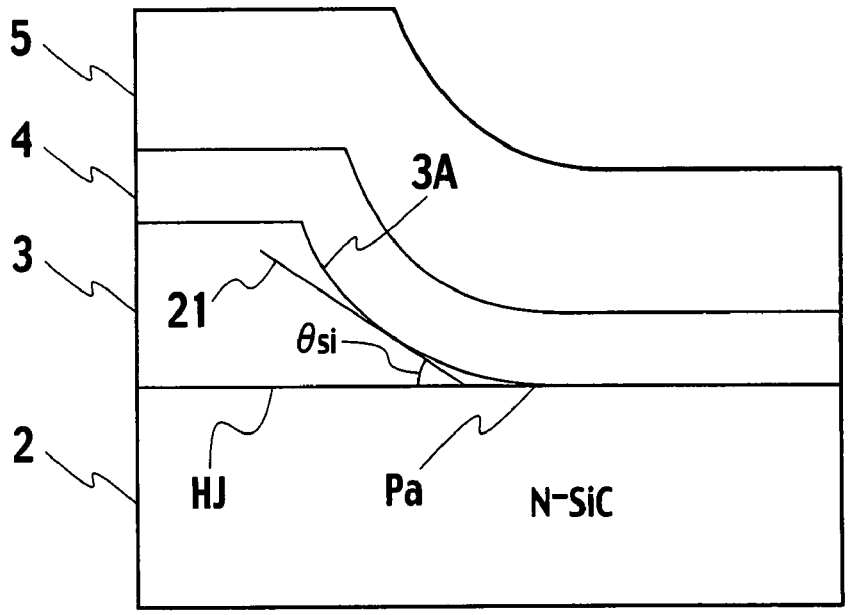
FIG. 8 shows a fourth modified structure of the semiconductor device, according to the first embodiment of the present invention.
Figure 9:
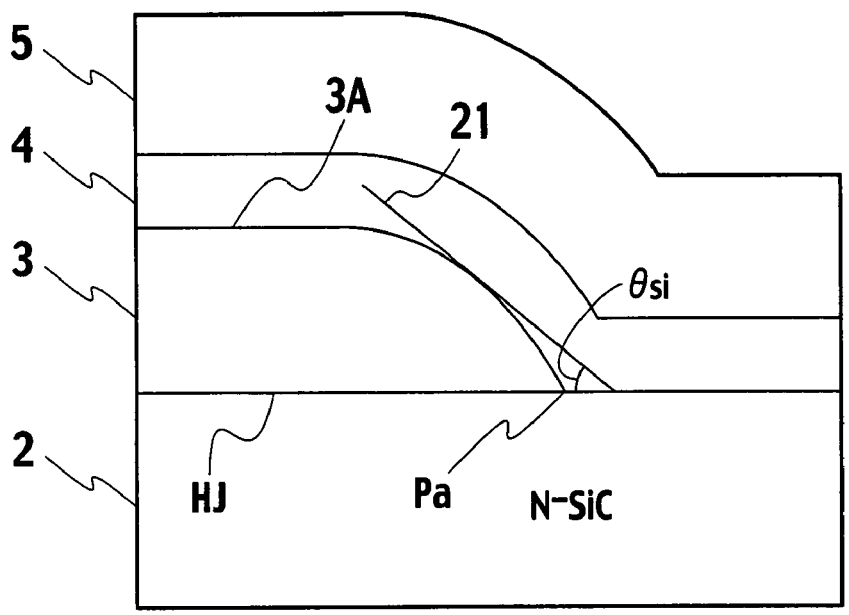
FIG. 9 shows a fifth modified structure of the semiconductor device, according to the first embodiment of the present invention.

FIG. 8 and FIG. 9 respectively show the fourth and fifth modified structures where the hetero semiconductor region 3 has a contact face 3A which contacts the gate insulating film 4 at the end part 16 of the hetero semiconductor region 3 and is curved, the first angle θsi (defined by the interface of the hetero junction HJ between the drain region 2 and the hetero semiconductor region 3, and a tangent 21 of an interface of a junction between the hetero semiconductor region 3 and the gate insulating film 4) at the end part 16 of the hetero semiconductor region 3 is variable when moving away from the triple point Pa. FIG. 8 shows the first angle θsi getting larger when moving more spaced apart leftward from the triple point Pa, while FIG. 9 shows the first angle θsi getting smaller when moving more spaced apart leftward from the triple point Pa. Any of the fourth and fifth modified structures meet the configuration for bringing about the above effect according to the first embodiment, thus bringing about similar effect.

Herein, the fourth modified structure in FIG. 8 having the triple point Pa (drive point) with more acute angle can bring about a greater drive force due to the above first and second reasons.

Varying i) the mask material type or ii) the gas condition for the reactive ion etching (dry etching) can controllably form the above configurations with ease.

Moreover, though not shown, any other configurations adjacent to the triple point Pa at least meeting that the distance tgs is smaller than the thickness tox allow the end part 16 of the hetero semiconductor region 3 to be obtuse instead of acute.

As set forth above, according to the first embodiment, the basic structure of the transistor capable of at least switch operation has been set forth, referring to FIG. 1. However, the following sixth to ninth modified structures shown respectively in FIG. 10 to FIG. 13 according to the first embodiment can also be provided in single or in plural.

Figure 10:
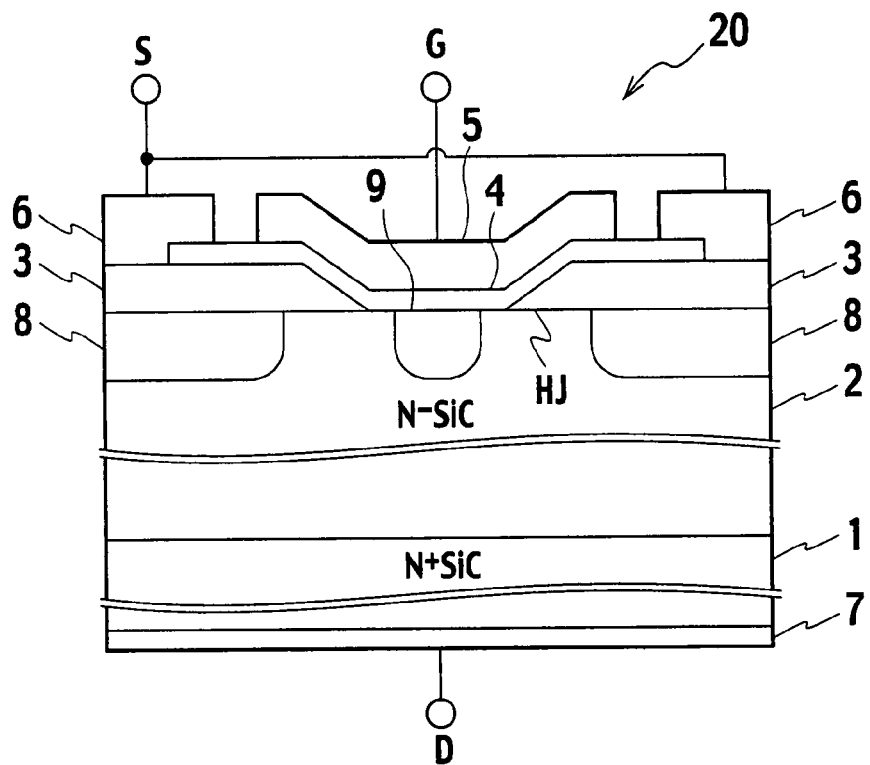
FIG. 10 shows a sixth modified structure of the semiconductor device, according to the first embodiment of the present invention.

In addition to the structure in FIG. 1, the structure in FIG. 10 has i) a first field relaxing region 8 so formed in the main face 2A of the drain region 2 as to contact the hetero semiconductor region 3 in a position spaced apart by a certain distance from a part where the gate electrode 5 and the hetero semiconductor region 3 oppose each other and ii) a second field relaxing region 9 so formed in the main face 2A of the drain region 2 as to contact the gate insulating film 4.

With the above structure, in the cutoff state of the transistor, the depletion layer expands, according to the drain potential, between i) the first field relaxing region 8 and the drain region 2 and between ii) the second field relaxing region 9 and the drain region 2. That is, the first field relaxing region 8 and the second field relaxing region 9 relax the drain field applied to the interface of the hetero junction HJ between the hetero semiconductor region 3 and the drain region 2, thereby decreasing leak current in the cutoff state of the transistor, resulting in improved cutoff property. In the sixth modified structure in FIG. 10, both of the first field relaxing region 8 and the second field relaxing region 9 are formed. In this case, however, forming of any one of the above two regions is allowed.

Figure 11:
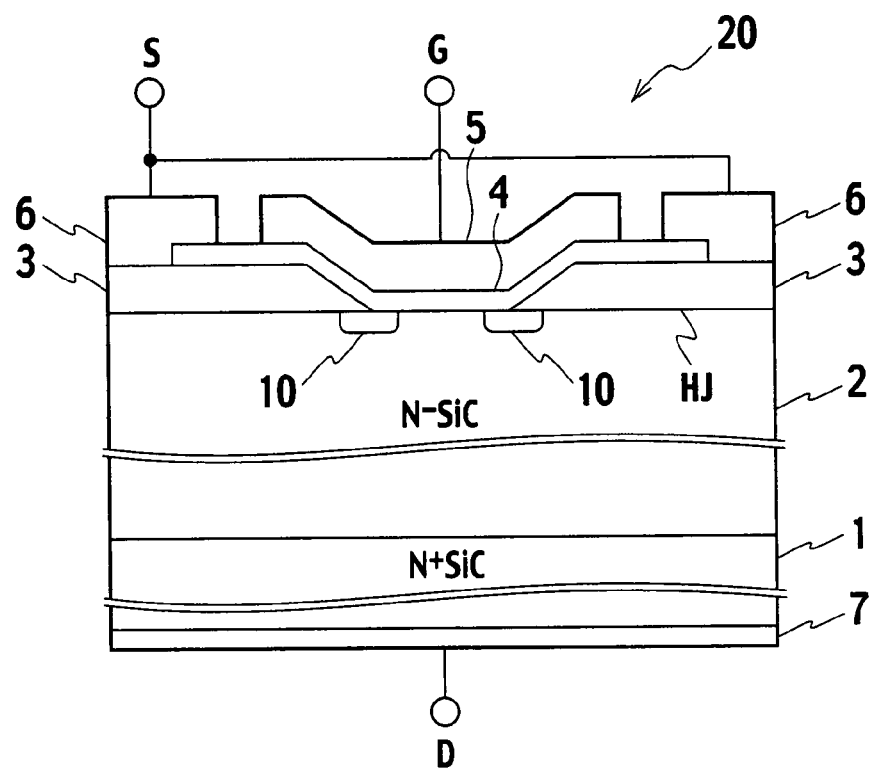
FIG. 11 shows a seventh modified structure of the semiconductor device, according to the first embodiment of the present invention.
Figure 12:
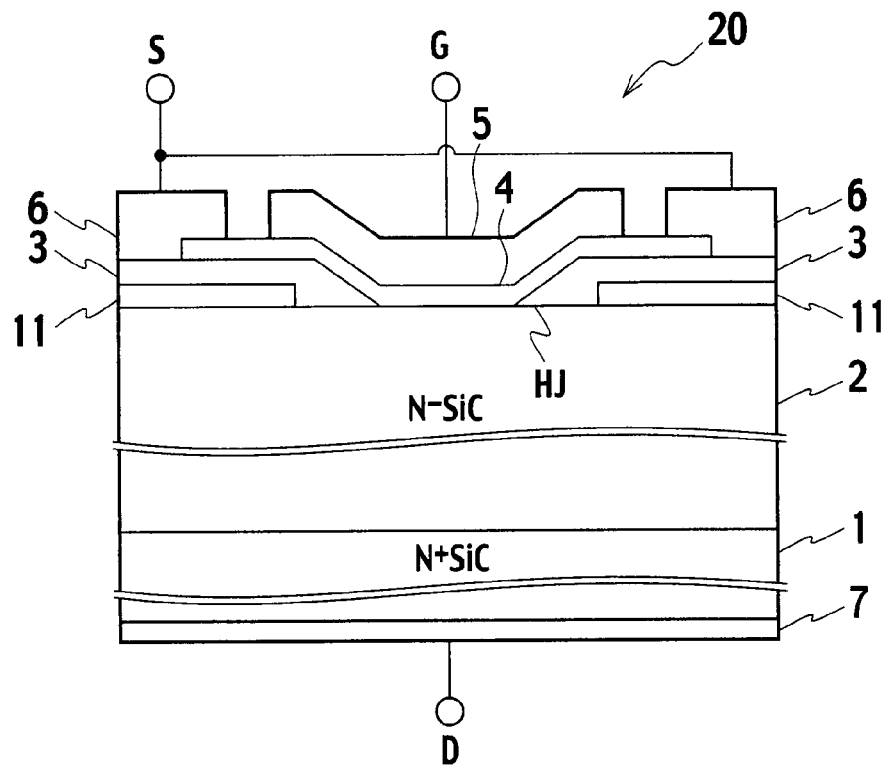
FIG. 12 shows an eighth modified structure of the semiconductor device, according to the first embodiment of the present invention.

In the seventh modified structure in FIG. 11, an $N^+$ type conductive region 10 having higher concentration than that of the drain region 2 is formed in the main face 2A of the drain region 2 with which face the gate insulating film 4 and the hetero semiconductor region 3 have a contact. In the conduction state of the transistor, the above structure relaxes the energy barrier of a hetero junction between the hetero semiconductor region 3 and the conductive region 10, bringing about still higher conductivity, that is, making the on resistance further smaller, resulting in improved conductivity.

Figure 13:
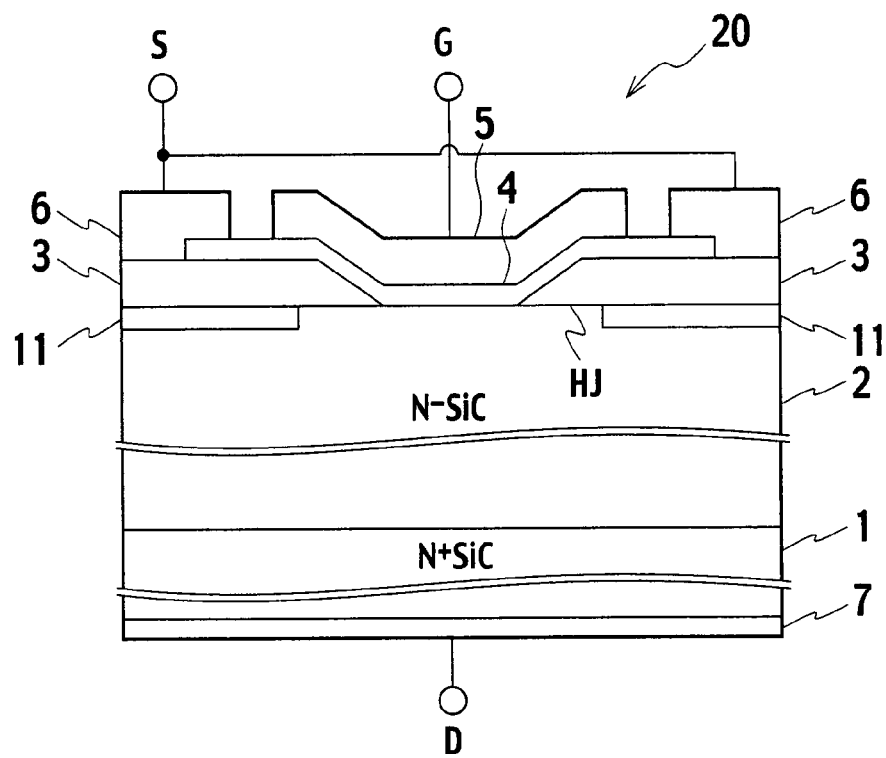
FIG. 13 shows a ninth modified structure of the semiconductor device, according to the first embodiment of the present invention.

In addition to the structure in FIG. 1, a field relaxing hetero semiconductor region 11 having a conduction type opposite to that of the hetero semiconductor region 3 is so formed in the hetero semiconductor region 3 (FIG. 12) as to contact the drain region 2 or formed in the drain region 2 (FIG. 13).

With the above structures, in the cutoff state of the transistor, a work function difference between the field relaxing hetero semiconductor region 11 and the drain region 2 becomes greater than a work function difference between the hetero semiconductor region 3 and the drain region 2, thereby further expanding the depletion layer on the drain region 2 side according to the drain potential. That is, the field relaxing hetero semiconductor region 11 having the great work function difference relaxes the drain field applied to the interface of the hetero junction HJ between the hetero semiconductor region 3 and the drain region 2, thereby decreasing the leak current in the cutoff state of the transistor, resulting in improved cutoff property.

Moreover, as shown in FIG. 13, forming the field relaxing hetero semiconductor region 11 in a position deeper than the triple point Pa can bring about still higher cutoff property.

As set forth above referring to FIG. 1 and FIG. 10 to FIG. 13, the hetero semiconductor region 3 is of N type, and the accumulative region is formed adjacent to the triple point Pa with the transistor in the conduction state. Otherwise, a P type channel region having an inverted region formed adjacent to the triple point Pa is allowed, bringing about the effect of the present invention.

Second Embodiment

[Structure]

Figure 14:
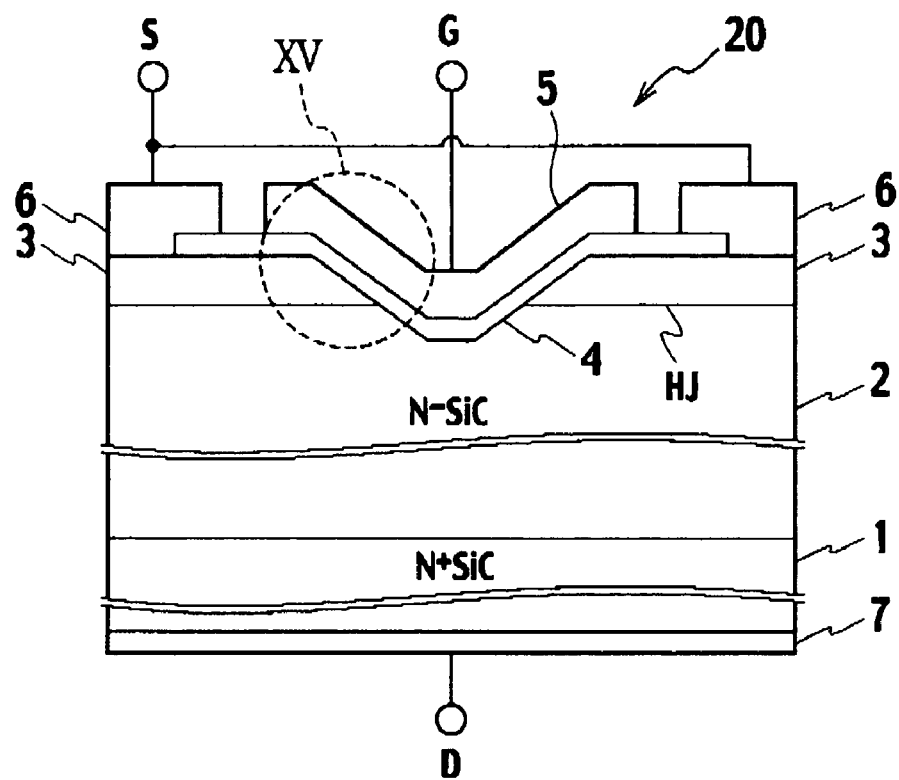
FIG. 14 is a cross sectional view showing the structure of the semiconductor device, according to a second embodiment of the present invention.

FIG. 14 is a cross sectional view showing the structure of the semiconductor device 20, according to the second embodiment of the present invention. In FIG. 14, two unit cells of the field effect transistor serving as the semiconductor device 20 according to the second embodiment oppose each other.

In FIG. 14, according to the second embodiment compared with the first embodiment in FIG. 1, the first angle $\theta$si at the end part 16 of the hetero semiconductor region 3 is acute (like the first embodiment), and the drain region 2 contacting the gate insulating film 4 is partly dug for receiving the gate insulating film 4.

Figure 15:
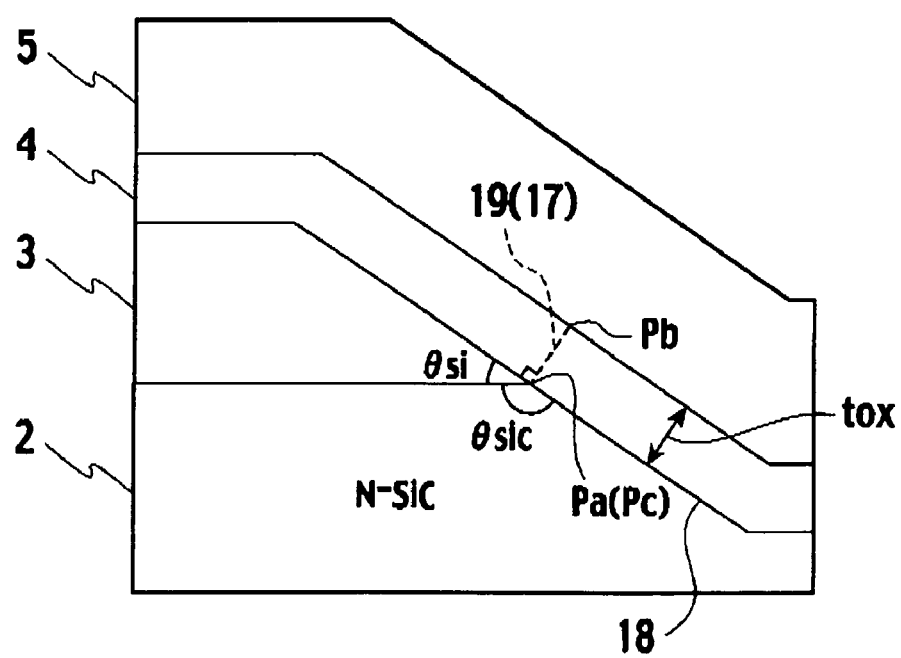
FIG. 15 shows an enlarged view of a part XV in FIG. 14.

FIG. 15 shows an enlarged view of a part XV encircled by a broken line in FIG. 14. As shown in FIG. 15, a second angle $\theta$sic is defined as to be formed between i) a face where the drain region 2 and the hetero semiconductor region 3 contact and ii) a face where the drain region 2 and the gate insulating film 4 contact. The second angle $\theta$sic is 180° according to the first embodiment, while the second angle $\theta$sic is less than or equal to 180° according to the second embodiment. According to the first embodiment, the distance tgs is expressed as 0<tgs<tox. With the above structure according to the second embodiment, the distance tgs is expressed as 0≦tgs<tox. That is, in FIG. 15 disclosing one example, with the shortest point Pb of the gate electrode 5 which point being shortest from the triple point Pa, the contact point Pc which is the end point of the vertical line 19 from the shortest point Pb to the drain region 2 contacting the gate insulating film 4 matches with the triple point Pa. That is, the distance tgs=0. With this, a further higher gate field is applied to the triple point Pa in the conduction state of the transistor according to the second embodiment, thereby further decreasing the on resistance than the first embodiment.

Moreover, the drain field at the triple point Pa in the conduction state of the transistor according to the second embodiment is as a large as that brought about according to the first embodiment. In addition, in the cutoff state of the transistor, a built-in potential from the gate electrode 5 can relax the drain field via the gate insulating film 4, according to the second embodiment. With this, the cutoff property of the transistor can be further increased.

Varying i) the type, thickness and configuration of the mask material for etching the hetero semiconductor region 3 and the drain region 2 or ii) the gas condition (type) for the reactive ion etching (dry etching) can easily control the configuration of the end part 16 of the hetero semiconductor region 3.

As set forth above, according to the second embodiment, the end part 16 structure of the hetero semiconductor region 3 and the dug structure of the drain region 2 are shown as one example in FIG. 15, for setting forth the specific effect. According to the second embodiment, however, the following first to fourth modified structures shown respectively in FIG. 16 to FIG. 19 can also bring about the similar effects.

FIG. 14 shows the hetero semiconductor region 3 and the drain region 2 each contacting the gate insulating film 4 have a flush face. Meanwhile, FIG. 16 and FIG. 17 show respectively the first and second modified structures where a part E1 (FIG. 16) and a part E2 (FIG. 17) each encircled by a broken line show that the gate insulating film 4 has an angle part from a position adjacent to the triple point Pa.

Figure 16:
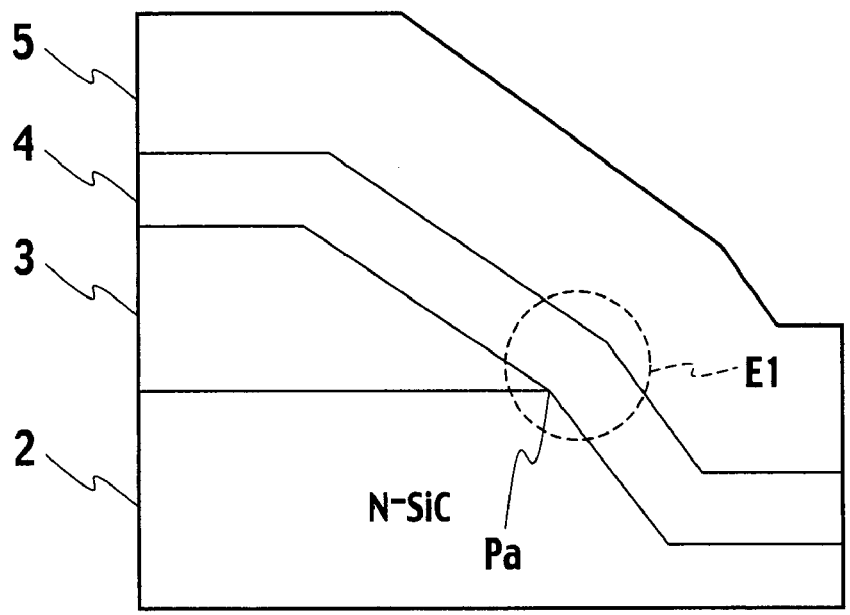
FIG. 16 shows a first modified structure of the semiconductor device, according to the second embodiment of the present invention.
Figure 17:
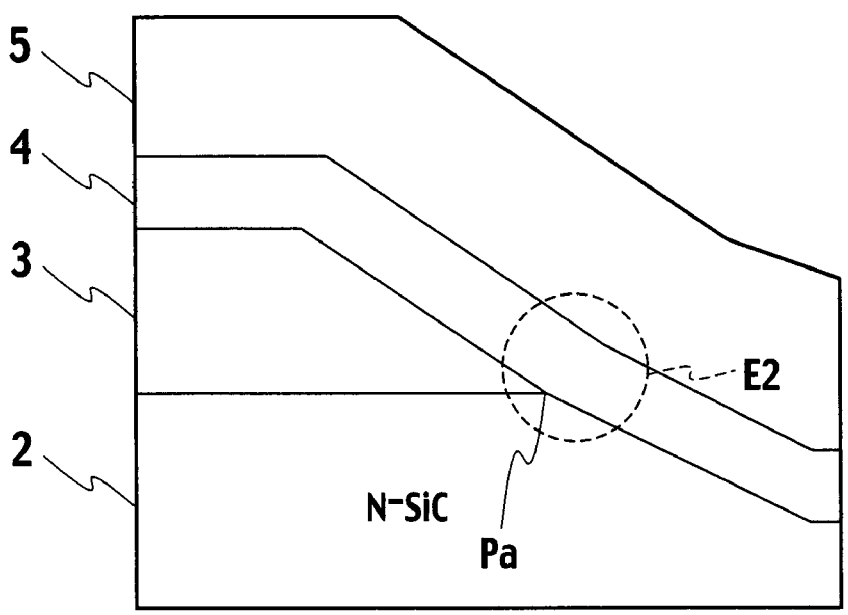
FIG. 17 shows a second modified structure of the semiconductor device, according to the second embodiment of the present invention.

For realizing, through the general semiconductor process, the acute angle configuration at the end part 16 of the hetero semiconductor region 3 and the digging of the drain region 2, the angle part shown in FIG. 16 and FIG. 17 are formed due to a combination with etching gas and the like. Under the present invention, any configurations at least meeting the second angle θsic of less than or equal to 180° can bring about the similar effect. From the viewpoint of easier productivity and the like, however, the second angle θsic of 90° or more is preferable.

Figure 18:
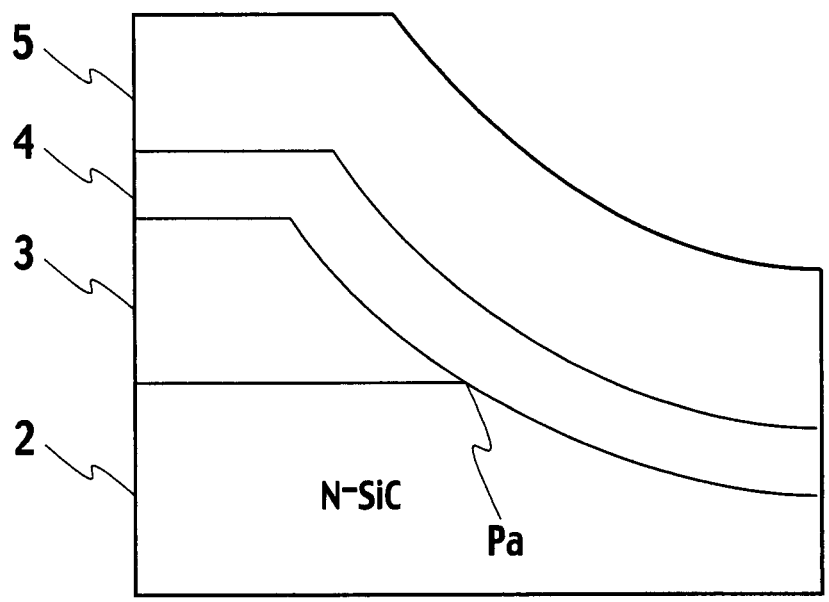
FIG. 18 shows a third modified structure of the semiconductor device, according to the second embodiment of the present invention.
Figure 19:
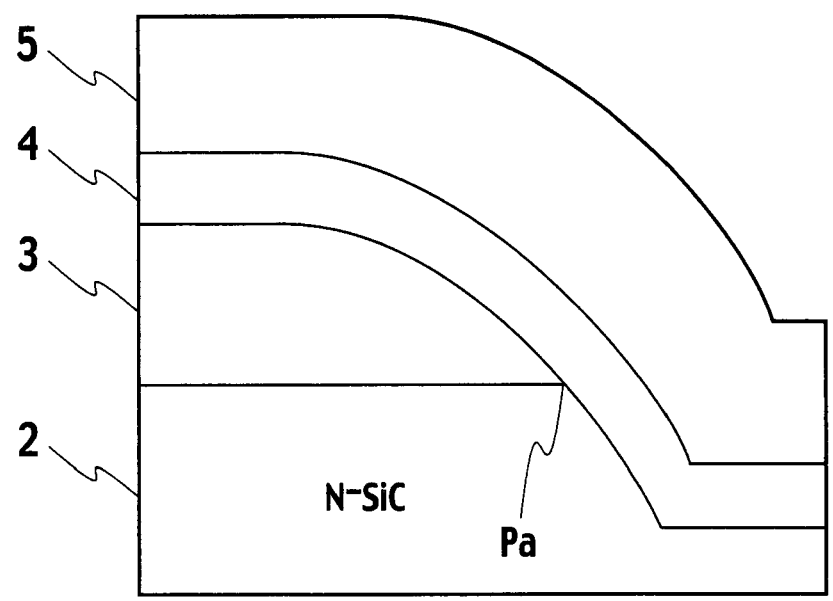
FIG. 19 shows a fourth modified structure of the semiconductor device, according to the second embodiment of the present invention.

FIG. 18 and FIG. 19 according to the second embodiment adopt the features of the modified structures respectively in FIG. 8 and FIG. 9 according to the first embodiment. Specifically, FIG. 18 and FIG. 19 each show the angle at the end part 16 of the hetero semiconductor region 3 is changed when moving more spaced apart from the triple point Pa. FIG. 18 shows the first angle θsi getting larger when moving more spaced apart leftward from the triple point Pa, while FIG. 19 shows the first angle θsi getting smaller when moving more spaced apart leftward from the triple point Pa. Any of the first to fourth modified structures according to the second embodiment bring about the effect of the present invention.

Moreover, though not shown, any other configurations adjacent to the triple point Pa at least meeting that the distance tgs is smaller than the thickness tox and the second angle θsic is less than or equal to 180° are allowed.

As set forth above, according to the second embodiment, the basic structure of the transistor capable of at least switch operation has been set forth referring to FIG. 14. However, the following fifth to eighth modified structures shown respectively in FIG. 20 to FIG. 23 according to the second embodiment can also be provided in single or in plural.

Figure 20:
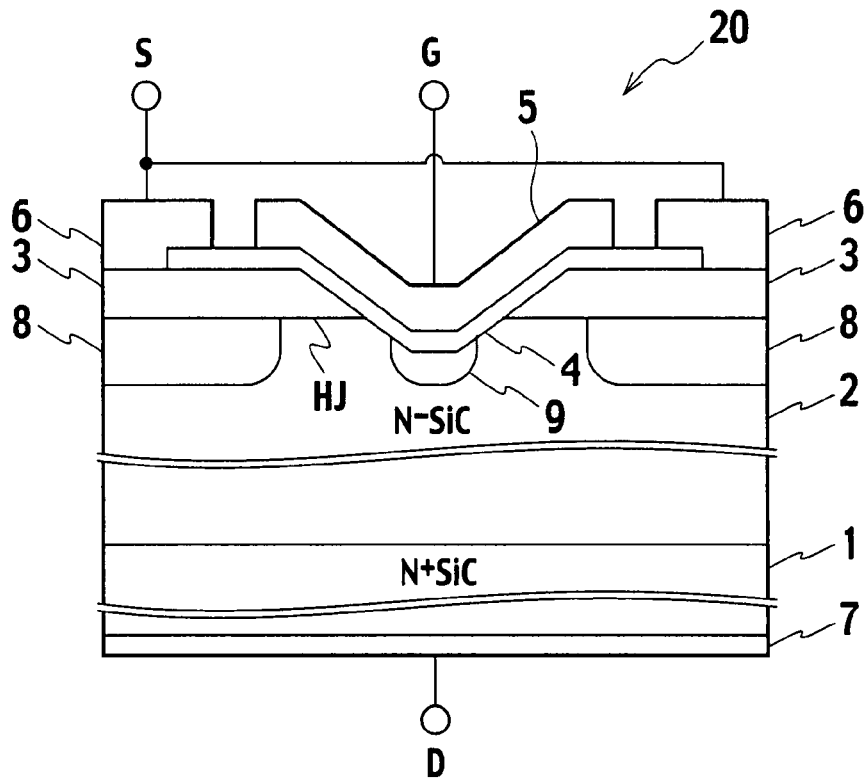
FIG. 20 shows a fifth modified structure of the semiconductor device, according to the second embodiment of the present invention.

In addition to the structure in FIG. 14, the structure in FIG. 20 has i) the first field relaxing region 8 so formed in the main face 2A of the drain region 2 as to contact the hetero semiconductor region 3 in the position spaced apart by the certain distance from the part where the gate electrode 5 and the hetero semiconductor region 3 oppose each other and ii) the second field relaxing region 9 so formed in the main face 2A of the drain region 2 as to contact the gate insulating film 4.

With the above structure, in the cutoff state of the transistor, the depletion layer expands, according to the drain potential, between i) the first field relaxing region 8 and the drain region 2 and between ii) the second field relaxing region 9 and the drain region 2. That is, the first field relaxing region 8 and the second field relaxing region 9 relax the drain field applied to the interface of the hetero junction HJ between the hetero semiconductor region 3 and the drain region 2, thereby decreasing the leak current in the cutoff state of the transistor, resulting in improved cutoff property. In the fifth modified structure in FIG. 20, both of the first field relaxing region 8 and the second field relaxing region 9 are formed. In this case, however, forming of any one of the above two regions is allowed.

Figure 21:
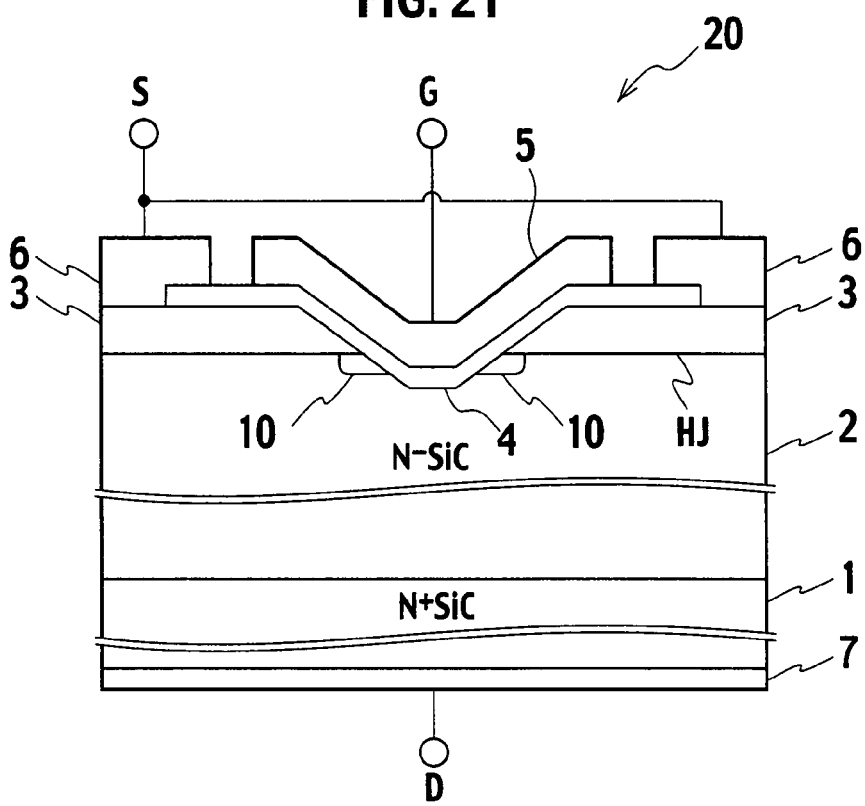
FIG. 21 shows a sixth modified structure of the semiconductor device, according to the second embodiment of the present invention.
Figure 22:
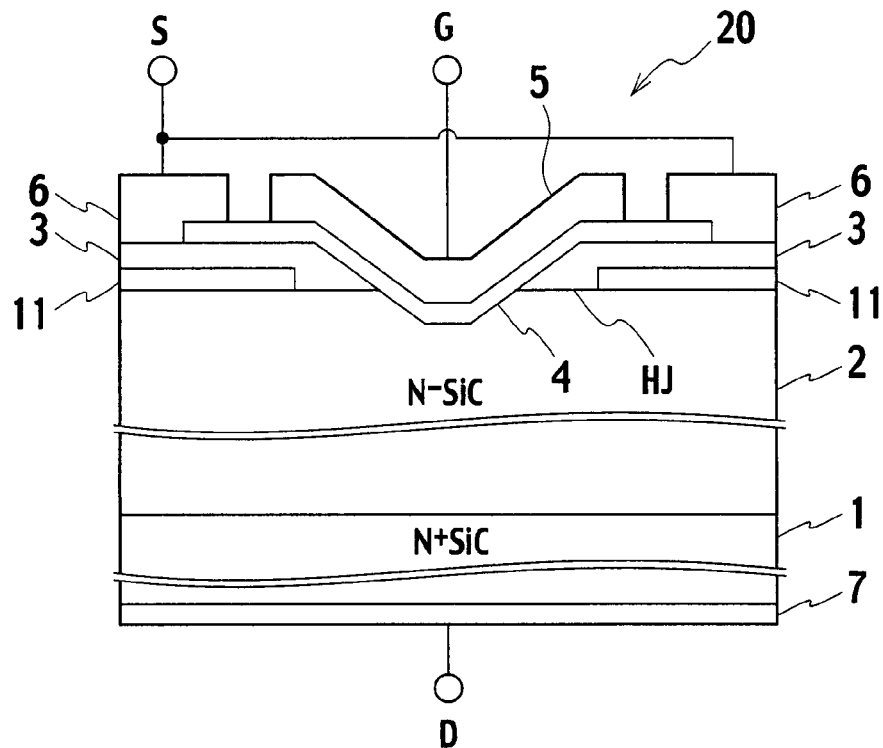
FIG. 22 shows a seventh modified structure of the semiconductor device, according to the second embodiment of the present invention.

With the sixth modified structure in FIG. 21, the $N^+$ type conductive region 10 having higher concentration than that of the drain region 2 is formed in the main face 2A of the drain region 2 with which face the gate insulating film 4 and the hetero semiconductor region 3 have a contact. In the conduction state of the transistor, the above structure relaxes the energy barrier of the hetero junction between the hetero semiconductor region 3 and the conductive region 10, bringing about still higher conductivity, that is, making the on resistance further smaller, resulting in improved conductivity.

Figure 23:
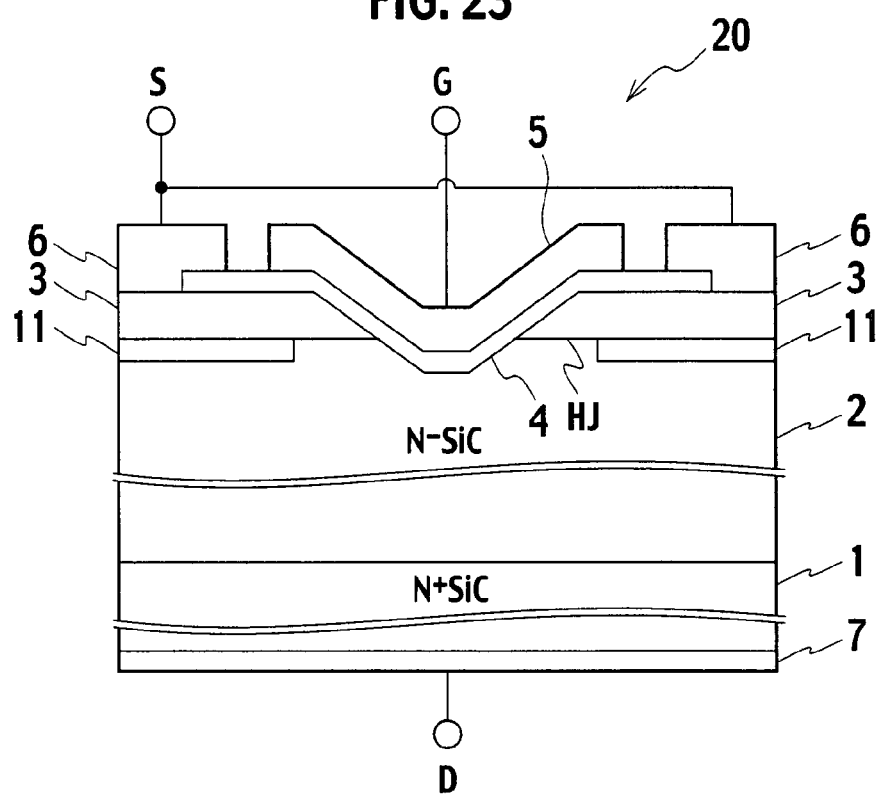
FIG. 23 shows an eighth modified structure of the semiconductor device, according to the second embodiment of the present invention.

In addition to the structure in FIG. 14, the field relaxing hetero semiconductor region 11 having the conduction type opposite to that of the hetero semiconductor region 3 is so formed in the hetero semiconductor region 3 (FIG. 22) as to contact the drain region 2 or formed in the drain region 2 (FIG. 23).

With the above structures, in the cutoff state of the transistor, the work function difference between the field relaxing hetero semiconductor region 11 and the drain region 2 becomes greater than the work function difference between the hetero semiconductor region 3 and the drain region 2, thereby further expanding the depletion layer on the drain region 2 side according to the drain potential. That is, the field relaxing hetero semiconductor region 11 having the great work function difference relaxes the drain field applied to the interface of the hetero junction HJ between the hetero semiconductor region 3 and the drain region 2, thereby decreasing the leak current in the cutoff state of the transistor, resulting in improved cutoff property.

Moreover, as shown in FIG. 23, forming the field relaxing hetero semiconductor region 11 in a position deeper than the triple point Pa can bring about still higher cutoff property.

As set forth above referring to FIG. 14 and FIG. 20 to FIG. 23, the hetero semiconductor region 3 is of N type, and the accumulative region is formed adjacent to the triple point Pa with the transistor in the conduction state. Otherwise, a P type channel region having the inverted region formed adjacent to the triple point Pa is allowed, bringing about the effect of the present invention.

Third Embodiment

[Structure]

Figure 24:
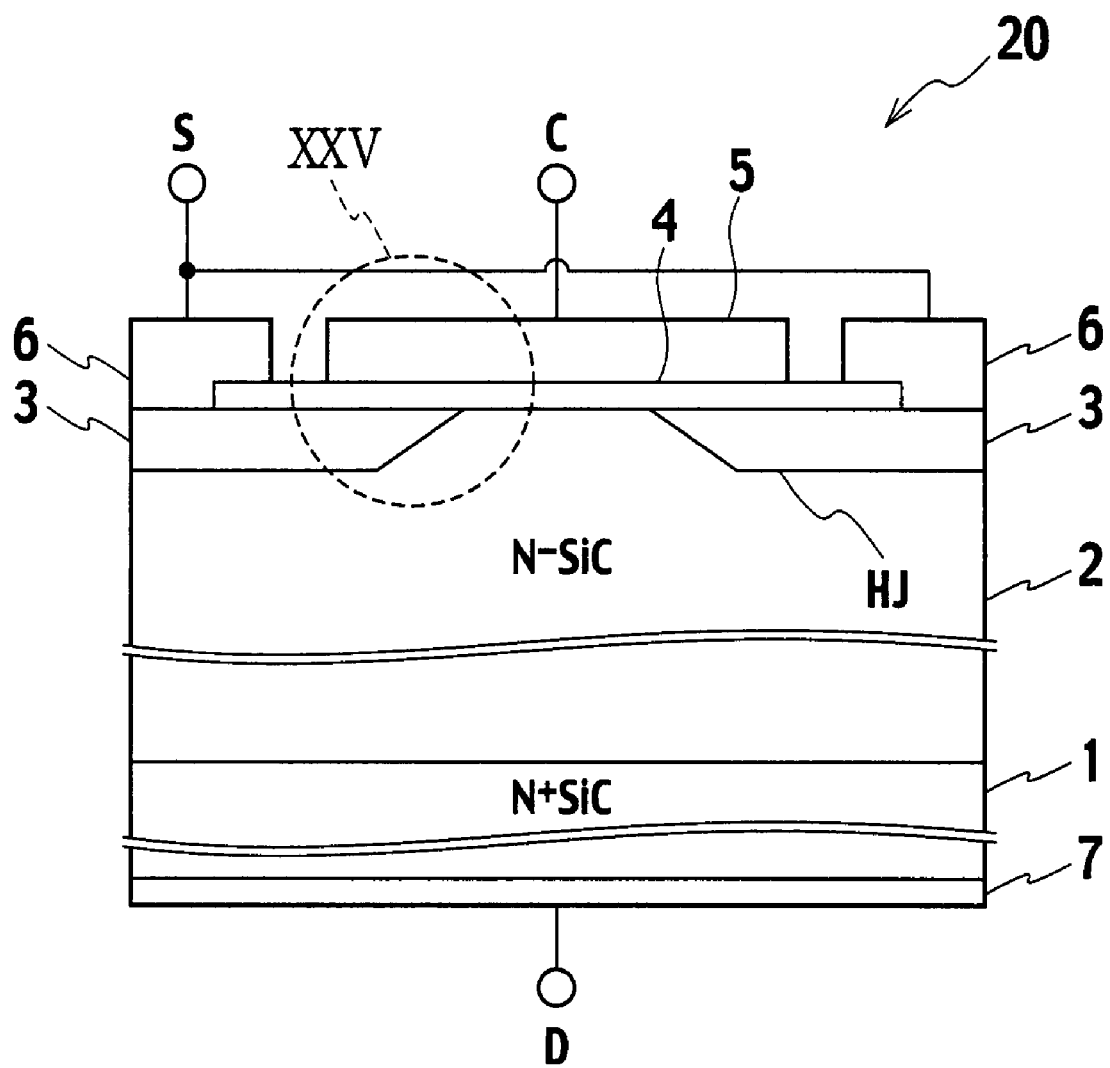
FIG. 24 is a cross sectional view showing the structure of the semiconductor device, according to a third embodiment of the present invention.

FIG. 24 is a cross sectional view showing the structure of the semiconductor device 20, according to the third embodiment of the present invention. In FIG. 24, two unit cells of the field effect transistor serving as the semiconductor device 20 according to the third embodiment oppose each other.

In FIG. 24, according to the third embodiment compared with the first embodiment in FIG. 1, the hetero semiconductor region 3 is embedded in a certain part of the drain region 2, the first angle θsi at the end part 16 of the hetero semiconductor region 3 is acute, and the second angle θsic is less than or equal to 180°.

Figure 25:
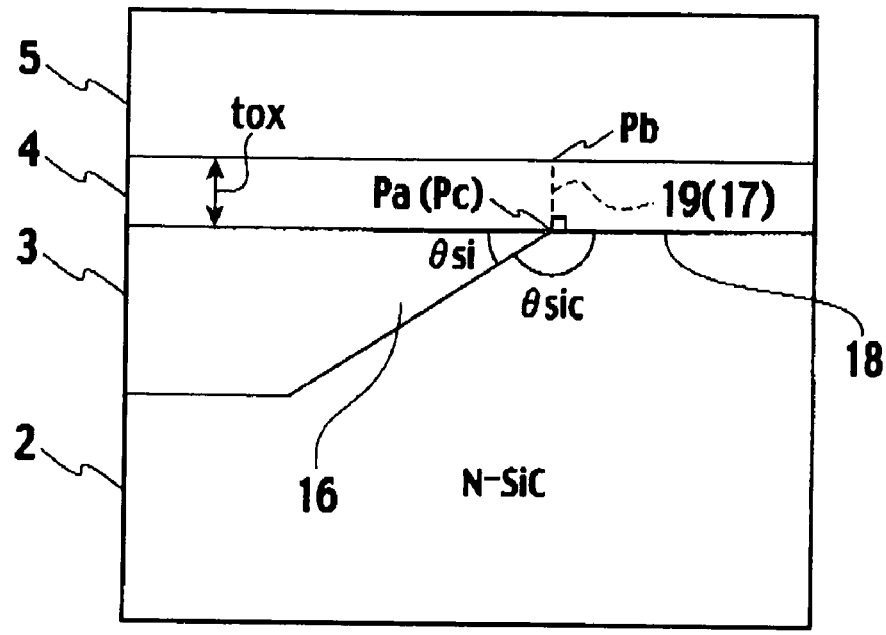
FIG. 25 shows an enlarged view of a part XXV in FIG. 24.

FIG. 25 shows an enlarged view of a part XXV encircled by a broken line in FIG. 24. As shown in FIG. 25, adopting the above structure according to the third embodiment can bring about the distance tgs in the range of 0≦tgs<tox, like the second embodiment, and unlike the range of 0<tgs<tox according to the first embodiment. That is, in FIG. 25 disclosing one example, with the shortest point Pb of the gate electrode 5 which point being shortest from the triple point Pa, the contact point Pc which is the end point of the vertical line 19 from the shortest point Pb to the drain region 2 contacting the gate insulating film 4 matches with the triple point Pa. That is, the distance tgs=0. With this, a further higher gate field is applied to the triple point Pa in the conduction state of the transistor according to the third embodiment, thereby further decreasing the on resistance than the first embodiment.

Moreover, the drain field at the triple point Pa in the conduction state of the transistor according to the third embodiment is as a large as that brought about according to the first embodiment. In addition, in the cutoff state of the transistor, the built-in potential from the gate electrode 5 can relax the drain field via the gate insulating film 4, according to the third embodiment. With this, the cutoff property of the transistor can be further increased.

Moreover, according to the third embodiment, in addition to the effects brought about according to the first embodiment and the second embodiment, the hetero semiconductor region 3 serving as a current path being formed flat can relax thermal stress concentration of the film per se (which stress may be caused by current concentration in the conduction state of the transistor), thus improving reliability.

According to the third embodiment, for example, the reactive ion etching (dry etching) selectively etches the drain region 2, followed by forming of the polycrystalline silicon layer, still followed by an etching back or CMP (Chemical Mechanical Polishing) treatment of the polycrystalline silicon layer. The above operations can easily embed the hetero semiconductor region 3 in the certain part of the drain region 2. Varying i) the type, thickness and configuration of the mask material for etching the drain region 2 or ii) the gas condition (type) for the reactive ion etching (dry etching) can easily control the configuration of the end part 16 of the hetero semiconductor region 3.

As set forth above, according to the third embodiment, the end part 16 structure and embedded structure of the hetero semiconductor region 3 are shown as one example in FIG. 25, for setting forth the specific effect. According to the third embodiment, however, the following first to third modified structures shown respectively in FIG. 26 to FIG. 28 can also bring about the similar effects.

Figure 26:
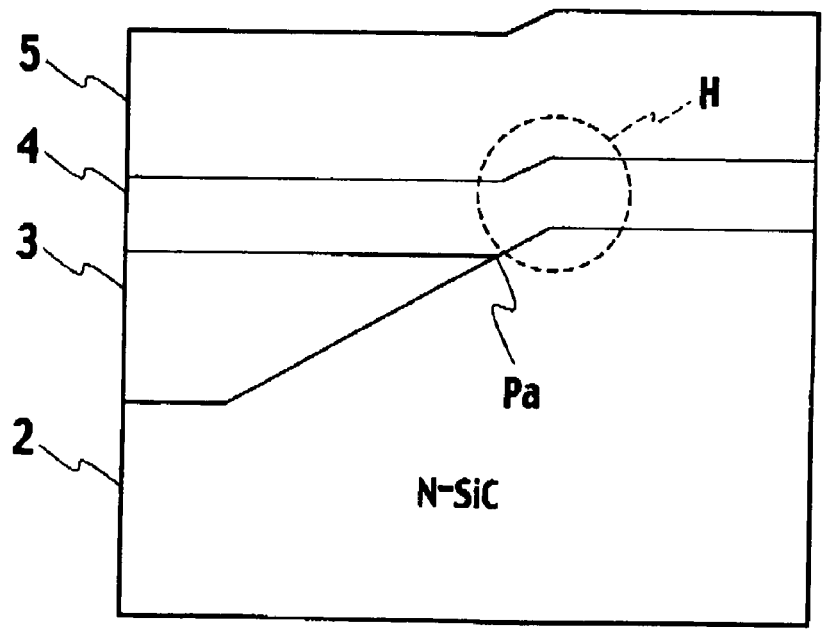
FIG. 26 shows a first modified structure of the semiconductor device, according to the third embodiment of the present invention.

FIG. 24 shows the hetero semiconductor region 3 and the drain region 2 each contacting the gate insulating film 4 have a flush face. Meanwhile, FIG. 26 shows the first modified structure where a part H encircled by a broken line shows that the gate insulating film 4 has an angle part from a position adjacent to the triple point Pa. The embedding of the hetero semiconductor region 3 through a general semiconductor process may make the hetero semiconductor region 3 higher or lower than the main face 2A of the drain region 2. Under the present invention, any configurations at least meeting the second angle θsic of less than or equal to 180° can bring about the similar effect.

Figure 27:
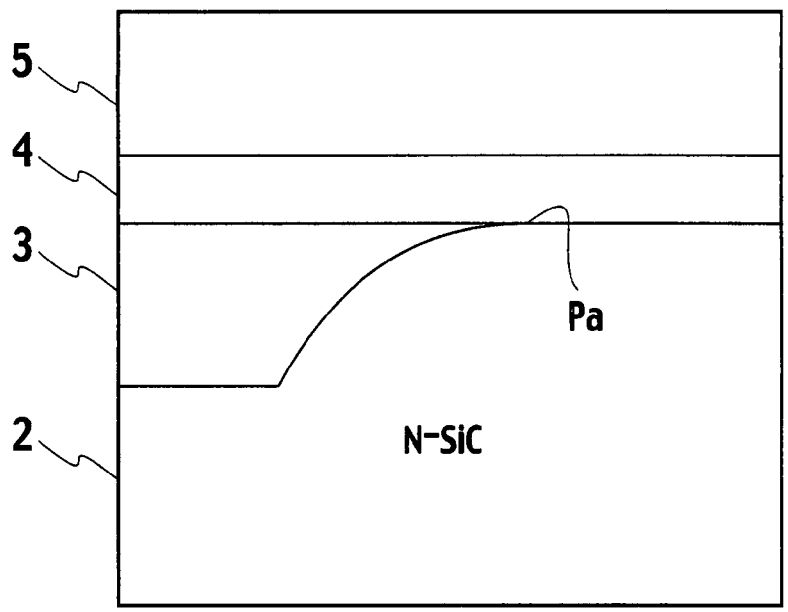
FIG. 27 shows a second modified structure of the semiconductor device, according to the third embodiment of the present invention.
Figure 28:
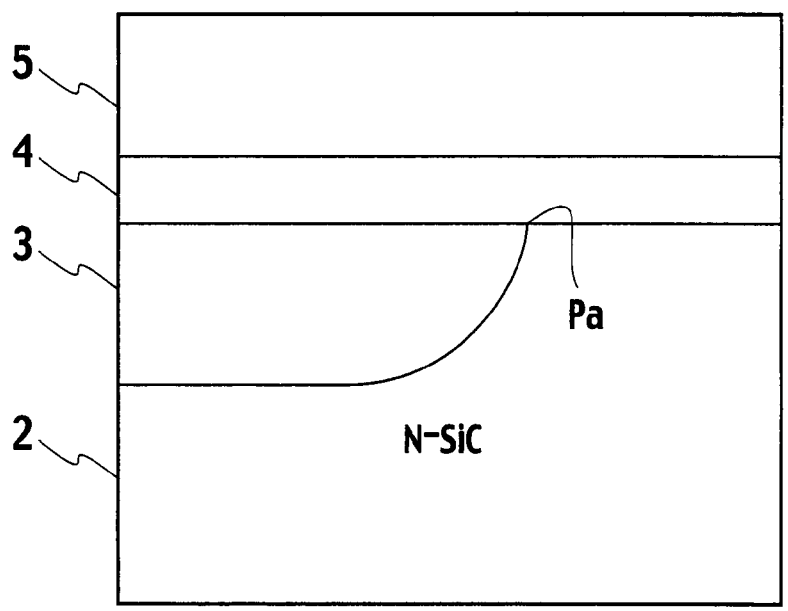
FIG. 28 shows a third modified structure of the semiconductor device, according to the third embodiment of the present invention.

FIG. 27 and FIG. 28 according to the third embodiment adopt the features of the modified structures respectively in FIG. 8 and FIG. 9 according to the first embodiment. Specifically, FIG. 27 and FIG. 28 each show the angle at the end part 16 of the hetero semiconductor region 3 is changed when moving more spaced apart from the triple point Pa. FIG. 27 shows the first angle θsi getting larger when moving more spaced apart leftward from the triple point Pa, while FIG. 28 shows the first angle θsi getting smaller when moving more spaced apart leftward from the triple point Pa. Any of the first to third modified structures according to the third embodiment bring about the effect of the present invention.

Moreover, though not shown, any other configurations adjacent to the triple point Pa at least meeting that the distance tgs is smaller than the thickness tox and the second angle θsic is less than or equal to 180° are allowed.

As set forth above, according to the third embodiment, the basic structure of the transistor capable of at least switch operation has been set forth, referring to FIG. 24. However, the following fourth to sixth modified structures shown respectively in FIG. 29 to FIG. 31 according to the third embodiment can also be provided in single or in plural.

Figure 29:
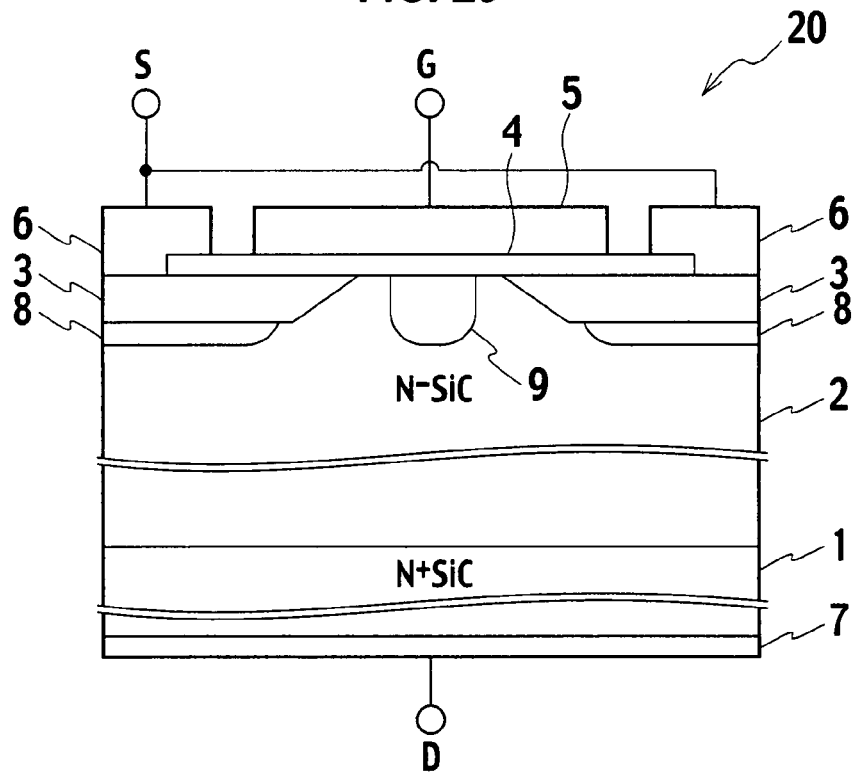
FIG. 29 shows a fourth modified structure of the semiconductor device, according to the third embodiment of the present invention.

In addition to the structure in FIG. 24, the structure in FIG. 29 has i) the first field relaxing region 8 so formed in the main face 2A of the drain region 2 as to contact the hetero semiconductor region 3 in the position spaced apart by the certain distance from the part where the gate electrode 5 and the hetero semiconductor region 3 oppose each other and ii) the second field relaxing region 9 so formed in the main face 2A of the drain region 2 as to contact the gate insulating film 4.

With the above structure, in the cutoff state of the transistor, the depletion layer expands, according to the drain potential, between i) the first field relaxing region 8 and the drain region 2 and between ii) the second field relaxing region 9 and the drain region 2. That is, the first field relaxing region 8 and the second field relaxing region 9 relax the drain field applied to the interface of the hetero junction HJ between the hetero semiconductor region 3 and the drain region 2, thereby decreasing the leak current in the cutoff state of the transistor, resulting in improved cutoff property. In the fourth modified structure in FIG. 29, both of the first field relaxing region 8 and the second field relaxing region 9 are formed. In this case, however, forming of any one of the above two regions is allowed.

Figure 30:
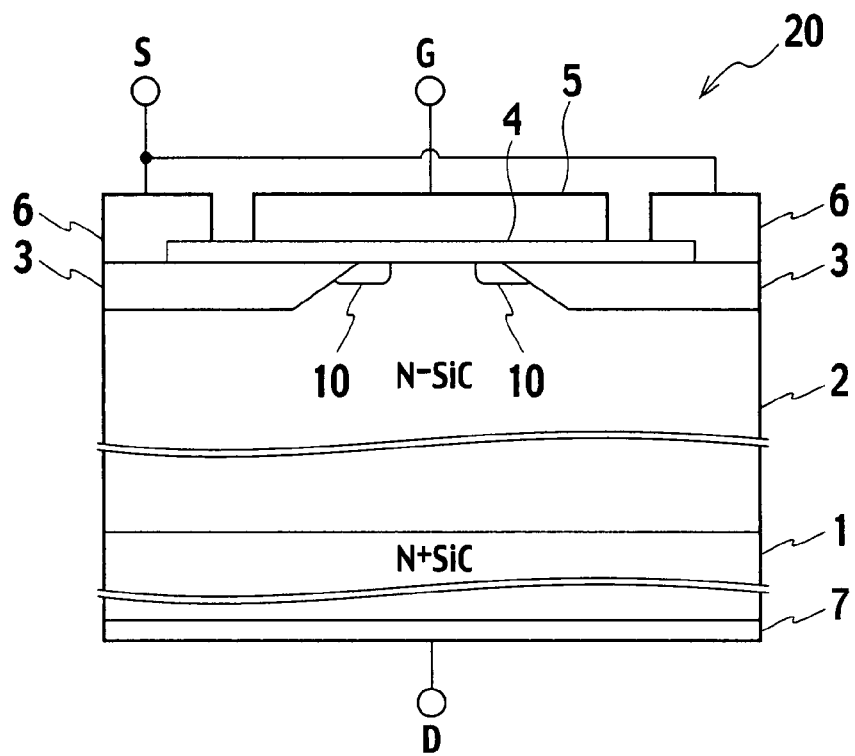
FIG. 30 shows a fifth modified structure of the semiconductor device, according to the third embodiment of the present invention.

With the fifth modified structure in FIG. 30, the $N^+$ type conductive region 10 having higher concentration than that of the drain region 2 is formed in the main face 2A of the drain region 2 with which face the gate insulating film 4 and the hetero semiconductor region 3 have a contact. In the conduction state of the transistor, the above structure relaxes the energy barrier of the hetero junction between the hetero semiconductor region 3 and the conductive region 10, bringing about still higher conductivity, that is, making the on resistance further smaller, resulting in improved conductivity.

Figure 31:
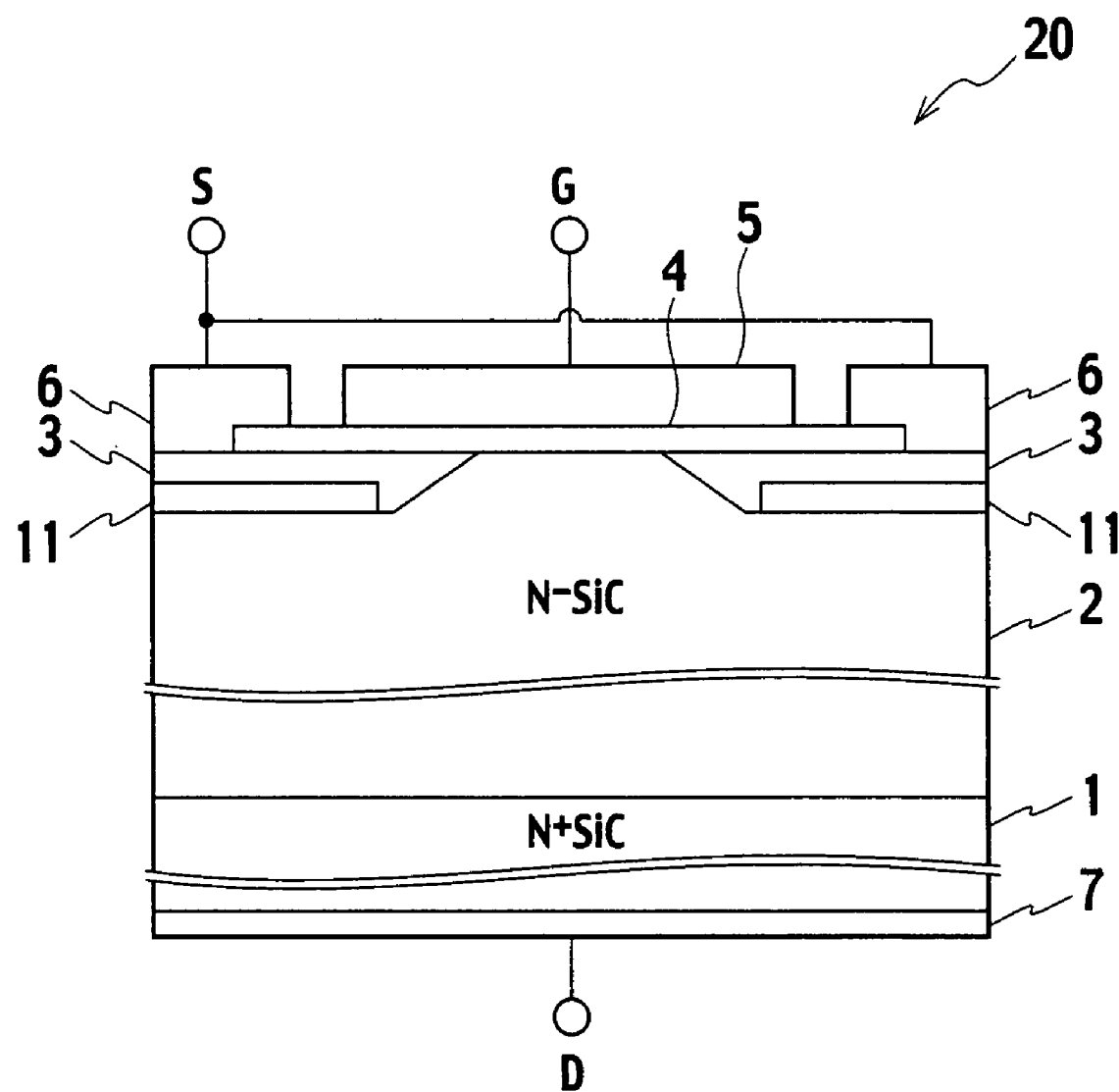
FIG. 31 shows a sixth modified structure of the semiconductor device, according to the third embodiment of the present invention.

In addition to the structure in FIG. 24, the field relaxing hetero semiconductor region 11 having the conduction type opposite to that of the hetero semiconductor region 3 is so formed in the hetero semiconductor region 3 as to contact the drain region 2 (FIG. 31).

With the above structure, in the cutoff state of the transistor, the work function difference between the field relaxing hetero semiconductor region 11 and the drain region 2 becomes greater than the work function difference between the hetero semiconductor region 3 and the drain region 2, thereby further expanding the depletion layer on the drain region 2 side according to the drain potential. That is, the field relaxing hetero semiconductor region 11 having the great work function difference relaxes the drain field applied to the interface of the hetero junction HJ between the hetero semiconductor region 3 and the drain region 2, thereby decreasing the leak current in the cutoff state of the transistor, resulting in improved cutoff property.

As set forth above referring to FIG. 24 and FIG. 29 to FIG. 31, the hetero semiconductor region 3 is of N type, and the accumulative region is formed adjacent to the triple point Pa with the transistor in the conduction state. Otherwise, a P type channel region having the inverted region formed adjacent to the triple point Pa is allowed, bringing about the effect of the present invention.

Although the present invention has been described above by reference to certain embodiments, the present invention is not limited to the embodiments described above. Modifications and variations of the embodiments described above will occur to those skilled in the art, in light of the above teachings.

According to the first to third embodiments, the semiconductor device 20 has the silicon carbide as substrate material. The present invention is, however, not limited to the above. The substrate material may be other semiconductor materials selected from the group consisting of silicon, silicon germane, gallium nitride, diamond and the like. Moreover, though 4H type is used for the polytype of the silicon carbide, other polytype structures such as 6H, 3C and the like are allowed. Moreover, what is called a longitudinal type transistor has been set forth, having the drain electrode 7 and the source electrode 6 oppositely disposed as to sandwich therebetween the drain region 2, flowing the drain current in the longitudinal direction. Otherwise, for example, what is called a lateral type transistor is allowed, having the drain electrode 7 and the source electrode 6 disposed on the same main face of the substrate, flowing the drain current in the lateral direction.

Moreover, the polycrystalline silicon is used for the material of the hetero semiconductor region 3 and the field relaxing hetero semiconductor region 11. The present invention is, however, not limited to the above. Any materials capable of forming the hetero junction with the silicon carbide are allowed, examples thereof including: i) silicon materials such as single crystalline silicon, amorphous silicon and the like, ii) other semiconductor materials such as germanium, silicon germane and the like, and iii) other polytype silicon carbide such as 6H, 3C and the like.

Moreover, the N type silicon carbide as the drain region 2 and the N type polycrystalline silicon as the hetero semiconductor region 3 have been set forth. The present invention is, however, not limited to the above. Combining the N type silicon carbide with the P type polycrystalline silicon, combining the P type silicon carbide with the P type polycrystalline silicon, and combining the P type silicon carbide with the N type polycrystalline silicon are allowed.

This application is based on a prior Japanese Patent Application No. P2006-066492 (filed on Mar. 10, 2006 in Japan). The entire contents of the Japanese Patent Application No. P2006-066492 from which priority is claimed are incorporated herein by reference, in order to take some protection against translation errors or omitted portions.

The scope of the present invention is defined with reference to the following claims.

What is claimed is:

1. A semiconductor device, comprising:
a first conductivity type semiconductor base having a main face;
a hetero semiconductor region configured to contact the main face of the semiconductor base and to form a hetero junction in combination with the semiconductor base, the semiconductor base and the hetero semiconductor region in combination defining a junction end part;
a gate insulating film configured to define a junction face in contact with the semiconductor base and to have a thickness; and
a gate electrode disposed adjacent to the junction end part via the gate insulating film and configured to have a shortest interval between the junction end part and the gate insulating film and to define a shortest point in a position away from the junction end part by the shortest interval, a line extending from the shortest point to a contact point on the junction face substantially vertically relative to the junction face, forming such a distance between the contact point and the junction end part as to be smaller than the thickness of the gate insulating film contacting the semiconductor base.

2. The semiconductor device as claimed in claim 1, further comprising:
a source electrode connected to the hetero semiconductor region, and
a drain electrode connected to the semiconductor base.

3. The semiconductor device as claimed in claim 2, wherein the semiconductor base includes:
a substrate region connected to the drain electrode, and
a drain region having the main face, and
a first angle of the junction end part between the drain region and the hetero semiconductor region is less than 90°.

4. The semiconductor device as claimed in claim 2, wherein the semiconductor base includes:
a substrate region connected to the drain electrode, and
a drain region having the main face, and
a first angle of the junction end part between the drain region and the hetero semiconductor region is more than 90°.

5. The semiconductor device as claimed in claim 1, wherein
a second angle defined by the following is less than or equal to 180°:
the hetero junction between the semiconductor base and the hetero semiconductor region, and
the junction face between the gate insulating film and the semiconductor base.

6. The semiconductor device as claimed in claim 1, wherein the semiconductor base is made of silicon carbide.

7. The semiconductor device as claimed in claim 1, wherein
the hetero semiconductor region is made of a material selected from the group consisting of single crystalline silicon, polycrystalline silicon and amorphous silicon.

8. The semiconductor device as claimed in claim 1, wherein
a thickness of the junction end part is smaller than the thickness of the gate insulating film.

9. The semiconductor device as claimed in claim 1, wherein
a certain step is formed in a position spaced apart from the junction end part.

10. The semiconductor device as claimed in claim 9, wherein
the certain step has any one of a right angle, an obtuse angle and an acute angle.

11. The semiconductor device as claimed in claim 3, wherein
the hetero semiconductor region has a contact face which contacts the gate insulating film at the junction end part and is curved,
the first angle is defined by:
an interface of the hetero junction between the drain region and the hetero semiconductor region, and
a tangent of an interface of a junction between the hetero semiconductor region and the gate insulating film, and
the first angle is variable when moving away from the junction end part.

12. The semiconductor device as claimed in claim 1, wherein
the distance is greater than 0 and less than the thickness of the gate insulating film.

13. The semiconductor device as claimed in claim 1, wherein
the distance is greater than or equal to 0 and less than the thickness of the gate insulating film.

14. The semiconductor device as claimed in claim 5, wherein the second angle is 90° or more.

* * * * *